US012207531B2

(12) United States Patent
Kang et al.

(10) Patent No.: US 12,207,531 B2
(45) Date of Patent: Jan. 21, 2025

(54) METHOD OF MANUFACTURING DISPLAY DEVICE COMPRISING SELECTIVELY REMOVING A CONDUCTIVE LAYER

(71) Applicant: Samsung Display Co., Ltd., Yongin-Si (KR)

(72) Inventors: Seungbae Kang, Yongin-si (KR); Heesung Yang, Yongin-si (KR); Byoungkwon Choo, Yongin-si (KR); Woojin Cho, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 448 days.

(21) Appl. No.: 17/506,163

(22) Filed: Oct. 20, 2021

(65) Prior Publication Data

US 2022/0209208 A1 Jun. 30, 2022

(30) Foreign Application Priority Data

Dec. 30, 2020 (KR) ........................ 10-2020-0188074

(51) Int. Cl.
*H10K 71/00* (2023.01)
*H10K 59/12* (2023.01)
*H10K 59/131* (2023.01)

(52) U.S. Cl.
CPC ........... *H10K 71/00* (2023.02); *H10K 59/131* (2023.02); *H10K 59/1201* (2023.02)

(58) Field of Classification Search
None
See application file for complete search history.

(56) References Cited

U.S. PATENT DOCUMENTS

| 8,674,359 B2 | 3/2014 | Noh et al. | |
| 2011/0266544 A1* | 11/2011 | Park | H10K 50/818 |
| | | | 257/59 |
| 2011/0303923 A1* | 12/2011 | Noh | H01L 29/4908 |
| | | | 257/E21.409 |

(Continued)

FOREIGN PATENT DOCUMENTS

| JP | 2002-305198 A | 10/2002 |
| KR | 10-1108175 B1 | 1/2012 |

(Continued)

*Primary Examiner* — Daniel Whalen
*Assistant Examiner* — Seyon Ali-Simah Punchbeddell
(74) *Attorney, Agent, or Firm* — Innovation Counsel LLP

(57) ABSTRACT

The method of manufacturing a display device includes preparing a substrate having a first and second area surrounding a portion of the first area, forming a semiconductor layer in the first area, forming a first insulating layer covering the semiconductor layer, forming a gate electrode layer that at least partially overlaps the semiconductor layer, forming a pad electrode layer in the second area, forming a second insulating layer covering the gate electrode layer, forming contact holes that at least partially expose the semiconductor layer and the gate electrode layer, and forming a conductive layer positioned in the contact holes and including a first and second layer. The forming of the conductive layer includes forming a first layer material and a second layer material, and removing a portion of the first layer material and a portion of the second layer material to expose the second insulating layer.

17 Claims, 17 Drawing Sheets

(56) References Cited

U.S. PATENT DOCUMENTS

| | | | | |
|---|---|---|---|---|
| 2013/0015456 A1* | 1/2013 | You | ................... | H01L 27/124 |
| | | | | 257/E33.053 |
| 2014/0346448 A1* | 11/2014 | You | ................... | H10K 59/124 |
| | | | | 438/46 |
| 2016/0071887 A1* | 3/2016 | Chao | ................... | H10K 59/124 |
| | | | | 257/72 |
| 2018/0108843 A1* | 4/2018 | Koo | ................... | H10K 71/621 |
| 2018/0123078 A1* | 5/2018 | Byun | ................ | H10K 59/1213 |
| 2018/0144950 A1* | 5/2018 | Jeong | ................ | H01L 21/32135 |
| 2019/0013380 A1* | 1/2019 | Oh | ................... | H10K 59/1216 |
| 2020/0105858 A1* | 4/2020 | Son | ................... | H10K 50/844 |
| 2021/0202540 A1* | 7/2021 | Kuwahara | ........... | H01L 27/1251 |

FOREIGN PATENT DOCUMENTS

| KR | 10-1610976 B1 | 4/2016 |
|---|---|---|
| KR | 10-2016-0069369 A | 6/2016 |
| KR | 10-1889950 B1 | 8/2018 |

\* cited by examiner

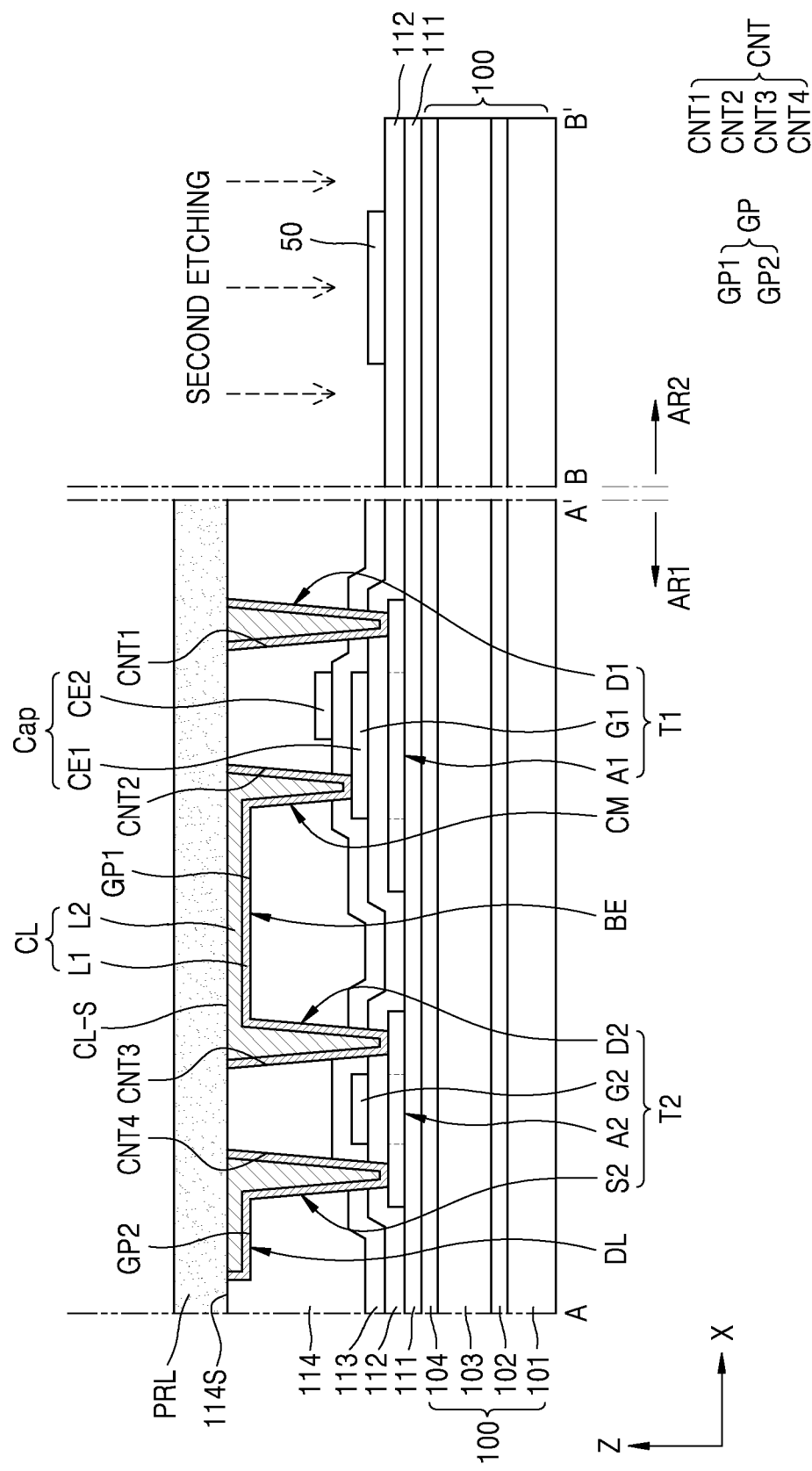

METHOD OF MANUFACTURING DISPLAY DEVICE COMPRISING SELECTIVELY REMOVING A CONDUCTIVE LAYER

CROSS-REFERENCE TO RELATED APPLICATION

This application is based on and claims priority under 35 U.S.C. § 119 to Korean Patent Application No. 10-2020-0188074, filed on Dec. 30, 2020, in the Korean Intellectual Property Office, the disclosure of which is incorporated by reference herein in its entirety.

BACKGROUND

1. Field

One or more embodiments relate to a method of manufacturing a display device, and more particularly, to a method of manufacturing a display device, which improves display quality and manufacturing quality.

2. Description of the Related Art

Mobile electronic devices are widely used. As mobile electronic devices, not only small electronic devices such as mobile phones but also tablet personal computers (PCs) have been widely used in recent years. Such mobile electronic devices include display devices to provide various functions, for example, to provide visual information such as images or videos to users. Display devices display data visually and may include a display area and a peripheral area outside the display area.

In the display area, a scan line and a data line are insulated from each other. A plurality of pixel circuits electrically connected to the scan line and the data line are arranged in the display area. Light-emitting elements are on the pixel circuits, and an image is provided by light emitted from the light-emitting elements.

The peripheral area is an area from which light is not emitted, and a driving integrated circuit or the like may be arranged in the peripheral area. Also, a pad portion for electrical connection to a control device may be arranged in the peripheral area. To this end, pad electrodes of the pad portion may be exposed to the outside.

SUMMARY

As a stack structure for forming a scan line, a data line, and a pixel circuit becomes more complicated, a height difference, e.g. step, may be formed on an upper surface of an insulating layer covering the stack structure. Because a light-emitting element is on the upper surface of the insulating layer, such a height difference also affects the light-emitting element. This may cause white angle difference (WAD) or may deteriorate display quality.

One or more embodiments include a method of manufacturing a display device, which improves display quality by minimizing the occurrence of a height difference. One or more embodiments include a method of manufacturing a display device, which improves manufacturing quality by preventing damage to pad electrodes that may occur during a process for minimizing the occurrence of a height difference.

Additional aspects will be set forth in part in the description which follows and, in part, will be apparent from the description, or may be learned by practice of the presented embodiments of the disclosure.

According to one or more embodiments, a method of manufacturing a display device includes preparing a substrate having a first area and a second area surrounding at least a portion of the first area. A semiconductor layer in the first area on the substrate is formed. A first insulating layer covering the semiconductor layer is formed. A gate electrode layer that at least partially overlaps the semiconductor layer is formed. A pad electrode layer in the second area on the substrate is formed. A second insulating layer covering the gate electrode layer is formed. Contact holes that at least partially expose the semiconductor layer and the gate electrode layer are formed. A conductive layer positioned in the contact holes and including a first layer and a second layer is formed. The forming of the conductive layer includes forming a first layer material covering the second insulating layer, the contact holes, and the pad electrode layer, forming a second layer material covering the first layer material, and removing a portion of the first layer material and a portion of the second layer material to expose the second insulating layer.

According to an embodiment, the removing of the portion of the first layer material and the portion of the second layer material may be performed by a chemical mechanical polishing (CMP) process.

According to an embodiment, the forming of the conductive layer may further include etching a portion of each of the first layer material and the second layer material positioned in the second area.

According to an embodiment, the etching of the portion of each of the first layer material and the second layer material positioned in the second area may include forming a photoresist layer covering the second insulating layer and the conductive layer, etching the portion of the second layer material positioned in the second area by using the photoresist layer as an etching mask, and etching the portion of the first layer material positioned in the second area by using the photoresist layer as an etching mask.

According to an embodiment, the conductive layer may include at least one of a source electrode of a thin-film transistor, a drain electrode of the thin-film transistor, and a data line.

According to an embodiment, the second layer of the conductive layer may be electrically connected to the semiconductor layer and the gate electrode layer through the first layer.

According to an embodiment, the first layer and the second layer of the conductive layer may include different materials from each other.

According to an embodiment, the first layer of the conductive layer may include indium tin oxide (ITO) or indium zinc oxide (IZO).

According to an embodiment, an upper surface of the conductive layer may form a flat surface with an upper surface of the second insulating layer.

According to an embodiment, the first layer of the conductive layer and the pad electrode layer may include different materials from each other.

According to an embodiment, an etching selectivity of the first layer of the conductive layer may be different from an etching selectivity of the pad electrode layer.

According to an embodiment, the gate electrode layer and the pad electrode layer may include a same material and are formed by a same process.

According to an embodiment, the pad electrode layer may include at least one of molybdenum (Mo), aluminum (Al), copper (Cu), and titanium (Ti).

According to one or more embodiments, a method of manufacturing a display device includes preparing a substrate having a first area and a second area surrounding at least a portion of the first area. A semiconductor layer in the first area on the substrate is formed. A pad electrode layer in the second area on the substrate is formed. At least one inorganic insulating layer covering the semiconductor layer is formed. A contact hole exposing at least a portion of the semiconductor layer in the at least one inorganic insulating layer is formed. A conductive layer positioned in the contact hole and having a first layer and a second layer is formed. At least one organic insulating layer on the at least one inorganic insulating layer is formed. A light-emitting element electrically connected to the conductive layer through a through hole formed in the at least one organic insulating layer is formed. The forming of the conductive layer includes forming a first layer material covering the at least one inorganic insulating layer, the contact hole, and the pad electrode layer, forming a second layer material covering the first layer material, and removing a portion of the first layer material and a portion of the second layer material positioned on the at least one inorganic insulating layer.

According to an embodiment, the removing of the portion of the first layer material and the portion of the second layer material may include performing a chemical mechanical polishing (CMP) process so that an uppermost surface of the at least one inorganic insulating layer is exposed and the uppermost surface of the at least one inorganic insulating layer and an upper surface of the conductive layer form a flat surface.

According to an embodiment, the forming of the conductive layer may further include etching a portion of the first layer material positioned in the second area and a portion of the second layer material positioned in the second area.

According to an embodiment, the etching of the portion of the first layer material positioned in the second area and the portion of the second layer material positioned in the second area may include forming a photoresist layer covering the at least one inorganic insulating layer and the conductive layer, etching the portion of the second layer material positioned in the second area by using the photoresist layer as an etching mask, and etching the portion of the first layer material positioned in the second area by using the photoresist layer as an etching mask.

According to an embodiment, the first layer and the second layer of the conductive layer may include different materials from each other.

According to an embodiment, the first layer of the conductive layer may include indium tin oxide (ITO) or indium zinc oxide (IZO).

According to an embodiment, the first layer of the conductive layer and the pad electrode layer may include different materials from each other, and an etching selectivity of the first layer of the conductive layer may be different from an etching selectivity of the pad electrode layer.

Other aspects and features of the disclosure will become better understood through the accompanying drawings, the claims and the detailed description.

These general and specific aspects may be implemented by using a system, a method, a computer program, or any combinations thereof.

BRIEF DESCRIPTION OF THE DRAWINGS

The above and other aspects and features of certain embodiments of the disclosure will be more apparent from the following description taken in conjunction with the accompanying drawings.

FIGS. 5A, 5B, 5C, 5D, 5E, 5F, 5G, 5H, 5I, 5J, 5K, and 5L are cross-sectional views schematically illustrating a part of a process of manufacturing a display device, according to an embodiment.

DETAILED DESCRIPTION

Figure 1:
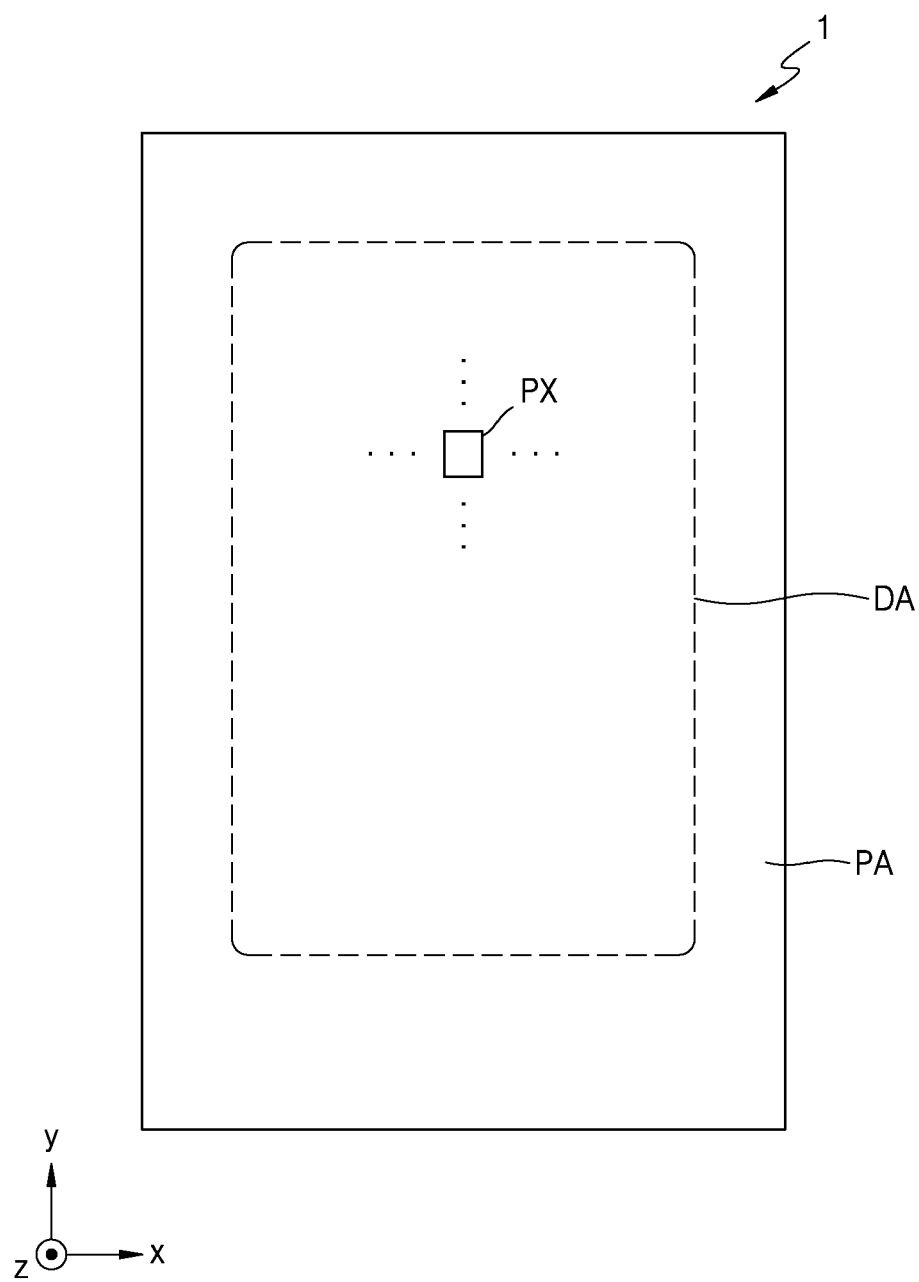
FIG. 1 is a schematic plan view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "comprises" and/or "comprising" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Sizes of elements in the drawings may be exaggerated or reduced for convenience of explanation.

When a certain embodiment may be implemented differently, a specific process order may be performed differently from the described order. For example, two consecutively described processes may be performed substantially at the same time or performed in an order opposite to the described order.

In this specification, the expression "A and/or B" indicates only A, only B, or both A and B. The expression "at least one of A and B" indicates only A, only B, or both A and B.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

The x-axis, the y-axis, and the z-axis are the three axes of the rectangular coordinate system in an embodiment but may be interpreted in a broader sense. For example, the x-axis, the y-axis, and the z-axis may be perpendicular to one another or may represent different directions that are not perpendicular to one another.

FIG. 1 is a schematic plan view of a display device 1 according to an embodiment.

Referring to FIG. 1, the display device 1 may include a display area DA and a peripheral area PA outside the display area DA. The display device 1 may provide an image through an array of a plurality of pixels PX that are two-dimensionally arranged in the display area DA. The pixel PX may be defined as an emission area in which a light-emitting element driven by a pixel circuit emits light. That is, an image may be provided by light emitted by the light-emitting element through the pixel PX.

The peripheral area PA is an area that does not provide an image, and may completely or partially surround the display area DA. A driver or the like, which provides an electric signal or power to the display area DA, may be located in the peripheral area PA. A pad portion, which is an area to which an electronic device, a printed circuit board, or the like may be electrically connected, may be located in the peripheral area PA.

A case in which the display device 1 includes an organic light-emitting diode (OLED) as the light-emitting element will be described below. However, according to an embodiment, the display device 1 may be a light-emitting display device including an inorganic light-emitting diode, that is, an inorganic light-emitting display. The inorganic light-emitting diode may include a PN junction diode including inorganic semiconductor-based materials. When a voltage is applied to the PN junction diode in a forward direction, holes and electrons may be injected and recombined to generate energy. The PN junction diode may convert the generated energy into light energy to emit light of a certain color. The inorganic light-emitting diode may have a width of several micrometers to several hundred micrometers. In some embodiments, the inorganic light-emitting diode may be referred to as a micro LED. According to an embodiment, the display device 1 may include a quantum dot light-emitting display.

The display device 1 may be used as display screens for various products such as not only portable electronic devices, such as mobile phones, smart phones, tablet personal computers (PCs), mobile communication terminals, electronic notebooks, e-books, portable multimedia players (PMPs), navigations, and ultra-mobile PCs (UMPCs), but also televisions (TVs), laptops, monitors, billboards, and internet of things (IoT) devices. The display device 1 according to an embodiment may also be used in wearable devices, such as smart watches, watch phones, glasses-type displays, or head mounted displays (HMDs). The display device 1 according to an embodiment may also be used in dashboards of automobiles, center information displays (CIDs) of the center fascia or dashboards of automobiles, room mirror displays that replace the side mirrors of automobiles, and display screens arranged on the rear sides of front seats to serve as entertainment devices for backseat passengers of automobiles.

Figure 2:
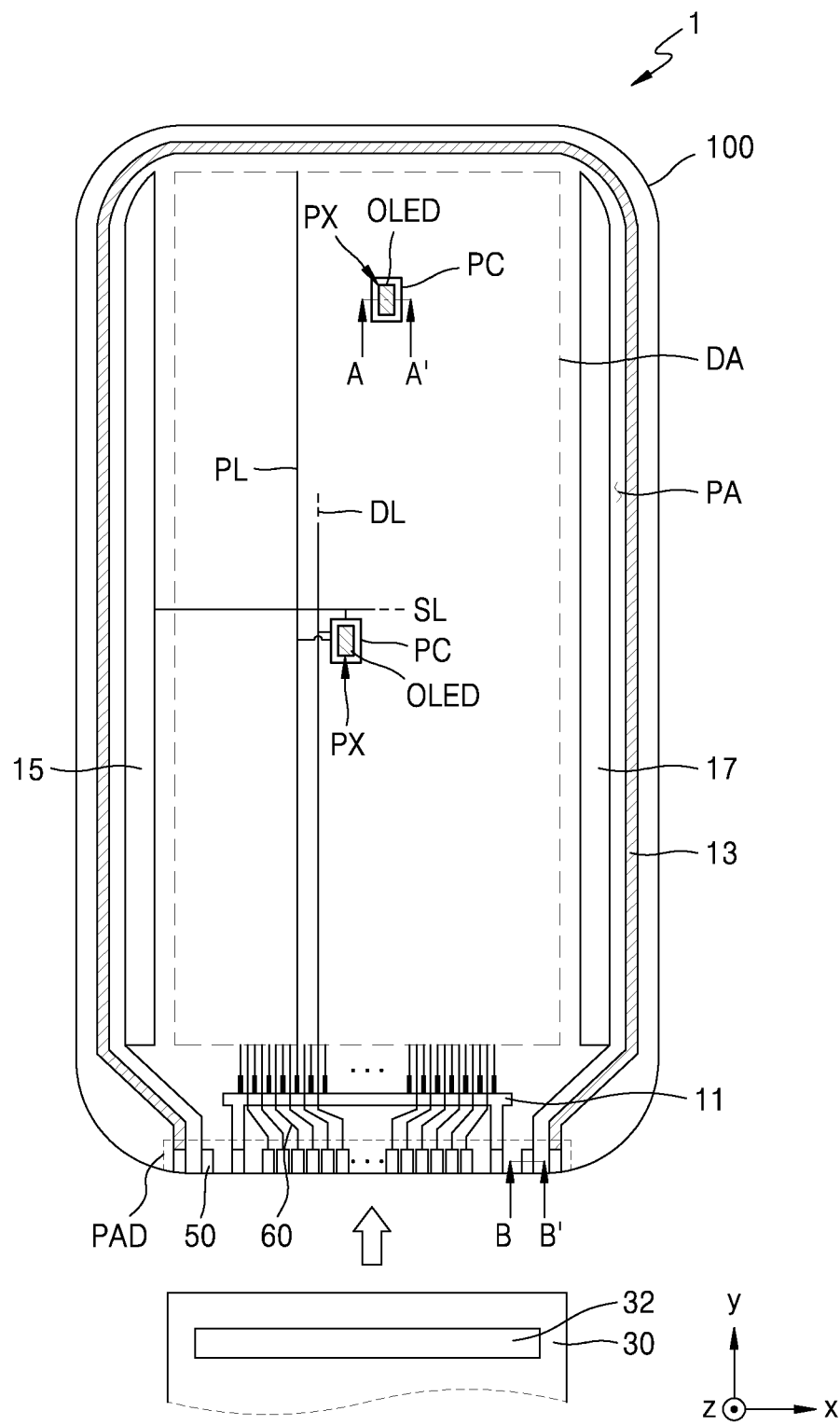
FIG. 2 is a schematic plan view of a display device according to an embodiment.

FIG. 2 is a schematic plan view of the display device 1 according to an embodiment.

Referring to FIG. 2, various elements constituting the display device 1 may be on a substrate 100. Pixel circuits PC, organic light-emitting diodes OLEDs respectively corresponding to the pixel circuits PC, and a plurality of signal lines passing through the display area DA may be on the substrate 100. The pixel circuits PC may be electrically connected to outer circuits in the peripheral area PA. In the peripheral area PA, a first scan driving circuit 15, a second scan driving circuit 17, a pad portion PAD, a driving voltage supply line 11, a common voltage supply line 13, and a fan-out line portion 60 electrically connecting the pad portion PAD to the signal lines may be arranged.

The first scan driving circuit 15 may apply a scan signal to each of the pixel circuits PC through a scan line SL passing through the display area DA. The second scan driving circuit 17 may be positioned on the opposite side of the first scan driving circuit 15 with the display area DA between the second scan driving circuit 17 and the first scan driving circuit 15, and may be substantially parallel to the first scan driving circuit 15. Some pixel circuits PC in the display area DA may be electrically connected to the first scan driving circuit 15, and the remaining pixel circuits PC may be electrically connected to the second scan driving circuit 17. The second scan driving circuit 17 may be omitted.

The pad portion PAD may be on one side of the substrate 100. The pad portion PAD may include a plurality of pad electrode layers 50. The pad electrode layers 50 are exposed without being covered with an insulating layer, and are connected to a display circuit board 30. A display driver 32 may be on the display circuit board 30. The display driver 32 may generate a control signal to be transmitted to the first scan driving circuit 15 and the second scan driving circuit 17. Also, the display driver 32 may supply a driving voltage, e.g., a driving voltage ELVDD in FIG. 3, to a driving voltage supply line 11 and supply a common voltage, e.g., a common voltage ELVSS in FIG. 3, to a common voltage supply line 13. The driving voltage ELVDD may be applied to the pixel circuit PC through a driving voltage line PL connected to the driving voltage supply line 11, and the common voltage ELVSS may be connected to the common voltage supply line 13 and applied to an opposite electrode of the organic light-emitting diode OLED. The display driver 32 may generate a data signal, and the generated data signal may be transmitted to the pixel circuit PC through the fan-out line portion 60 and a data line connected to the fan-out line portion 60 and passing through the display area DA.

The driving voltage supply line 11 may extend from the lower side of the display area DA in the x direction. The common voltage supply line 13 may have a shape in which one side is open in a loop shape, and may partially surround the display area DA.

Figure 3:
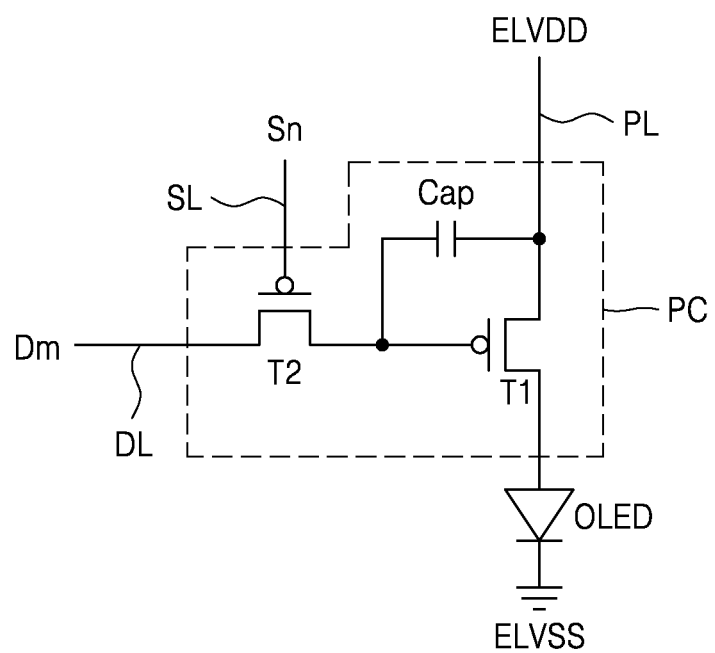
FIG. 3 is an equivalent circuit diagram of a pixel circuit included in an electronic device, according to an embodiment.

FIG. 3 is an equivalent circuit diagram of a pixel circuit PC included in an electronic device, according to an embodiment.

Referring to FIG. 3, a display device may include the pixel circuit PC and an organic light-emitting diode OLED that emits light by receiving a driving voltage through the pixel circuit PC.

The pixel circuit PC may include a plurality of thin-film transistors (TFTs) and a storage capacitor. According to an embodiment, as illustrated in FIG. 3, the pixel circuit PC may include a first TFT T1, a second TFT T2, and a storage capacitor Cap. For example, the first TFT T1 may be a driving TFT, and the second TFT T2 may be a switching TFT. The second TFT T2 may be connected to a scan line SL and a data line DL and may be configured to transmit, to the first TFT T1, a data signal Dm input through the data line DL in response to a scan signal Sn input through the scan line SL.

The storage capacitor Cap may be connected to the second TFT T2 and the driving voltage line PL and may be configured to store a voltage corresponding to a difference between the driving voltage ELVDD applied to the driving voltage line PL and an arbitrary voltage applied to the second TFT T2.

The first TFT T1 may be connected to the driving voltage line PL and the storage capacitor Cap and may be configured to control a driving current flowing from the driving voltage line PL to the organic light-emitting diode OLED in response to a voltage value stored in the storage capacitor Cap. The opposite electrode of the organic light-emitting diode OLED may be connected to the common voltage ELVSS. The organic light-emitting diode OLED may display an image by emitting light having a certain luminance according to the driving current.

A case in which the pixel circuit PC includes two TFTs T1, T2 and one storage capacitor Cap has been described with reference to FIG. 3. However, for example, the pixel circuit PC may include three or more TFTs and/or two or more storage capacitors. According to an embodiment, the pixel circuit PC may include seven TFTs and one storage capacitor. The number of TFTs and the number of storage capacitors may be variously changed according to the design of the pixel circuit PC. However, for convenience of description, a case in which the pixel circuit PC includes two TFTs and one storage capacitor will be described.

Figure 4A:
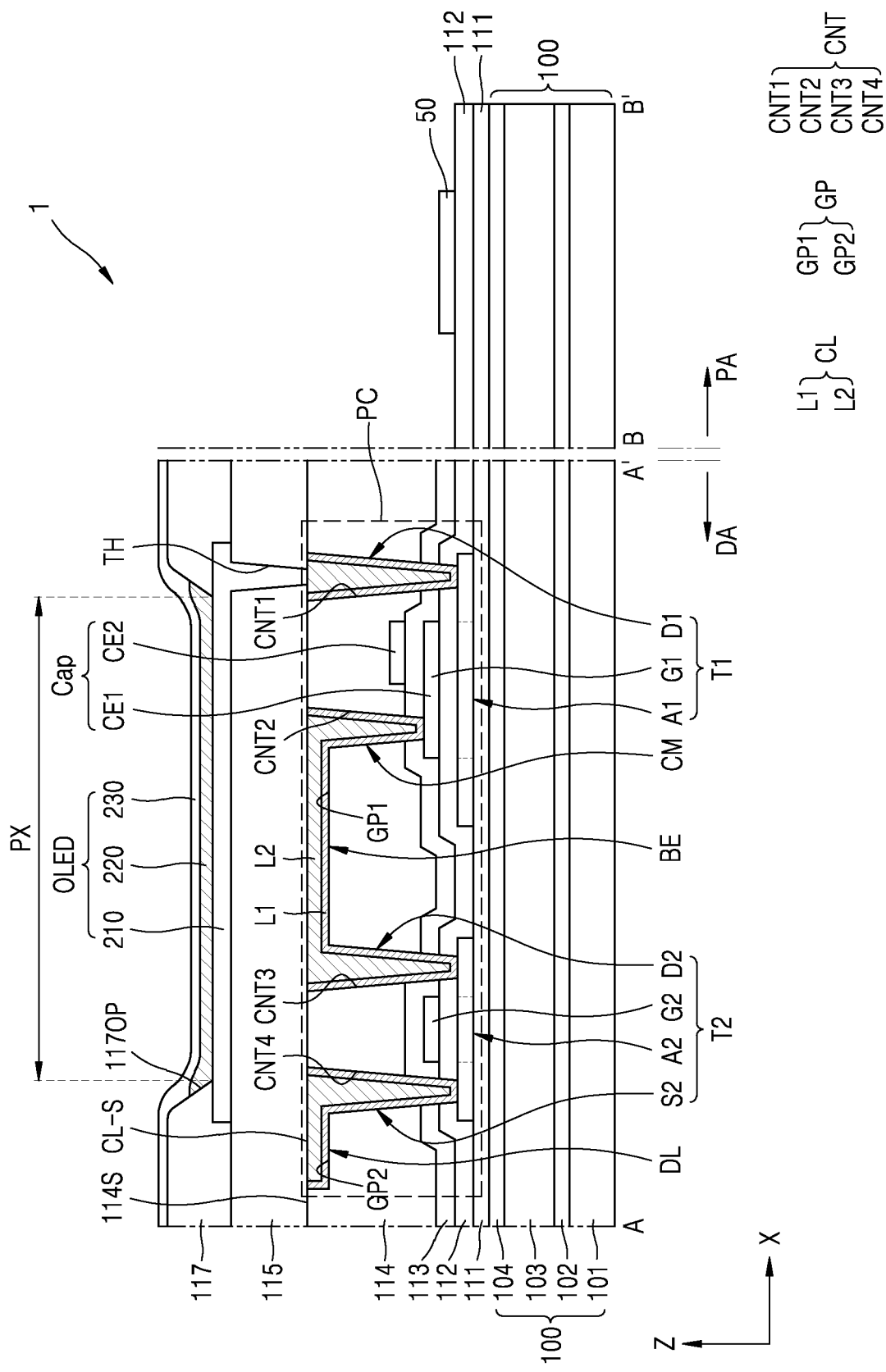
FIG. 4A is a schematic cross-sectional view of a portion of the display device, according to an embodiment.
Figure 4B:
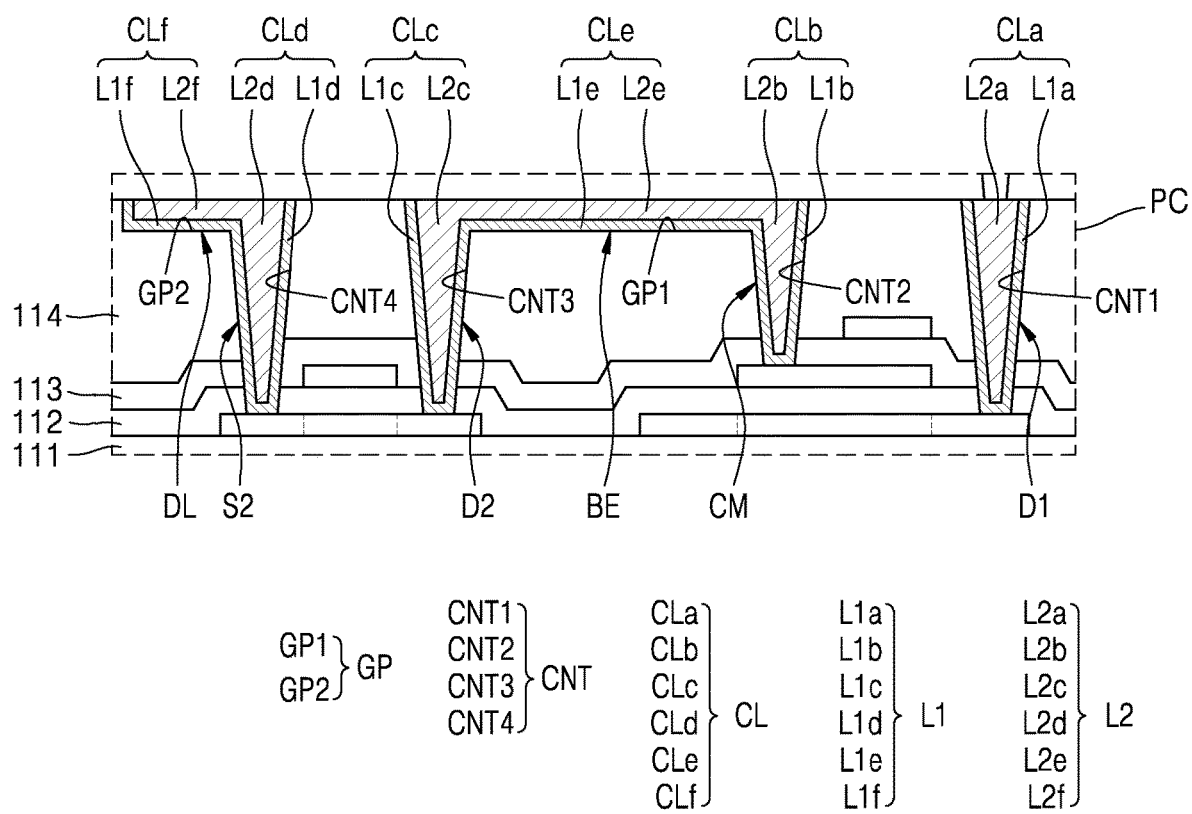
FIG. 4B is an enlarged cross-sectional view of a conductive layer of FIG. 4A.

FIG. 4A is a schematic cross-sectional view of a portion of the display device 1, according to an embodiment, and corresponds to a cross-sectional view of the display device 1 taken along lines A-A' and B-B' of FIG. 2. FIG. 4B is an enlarged cross-sectional view of a conductive layer of FIG. 4A.

Referring to FIG. 4A, the substrate 100 may include glass or a polymer resin. The substrate 100 including a polymer resin may include a flexible substrate that is bendable, foldable, or rollable. According to an embodiment, the substrate 100 may have a multilayer structure including a base layer including a polymer resin and a barrier layer including an inorganic insulating material. For example, the substrate 100 may include a first base layer 101, a first barrier layer 102, a second base layer 103, and a second barrier layer 104, which are sequentially stacked. The first base layer 101 and the second base layer 103 may include, for example, polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The first barrier layer 102 and the second barrier layer 104 may include, for example, silicon oxide, silicon oxynitride, and/or silicon nitride.

A buffer layer 111 may be on the substrate 100, may reduce or prevent infiltration of foreign material, moisture, or ambient air from below the substrate 100, and may provide a flat surface on the substrate 100. The buffer layer 111 may include an inorganic material such as an oxide or a nitride, an organic material, or an organic/inorganic composite material, and may have a single-layer or multilayer structure including an inorganic material and an organic material. A barrier layer (not illustrated) that blocks infiltration of ambient air may be further included between the substrate 100 and the buffer layer 111.

Referring to the display area DA on the substrate 100, the pixel circuit PC may be on the buffer layer 111. As described above, the pixel circuit PC may include a first TFT T1, a second TFT T2, and a storage capacitor Cap.

The first TFT T1 may include a first semiconductor layer A1, a first gate electrode layer G1, a first source electrode (not illustrated), and a first drain electrode D1. The second TFT T2 may include a second semiconductor layer A2, a second gate electrode layer G2, a second source electrode S2, and a second drain electrode D2.

The first TFT T1 may be electrically connected to the organic light-emitting diode OLED, which is the light-emitting element, to function as a driving TFT that drives the organic light-emitting diode OLED. The second TFT T2 may be electrically connected to the data line DL to function as a switching TFT. However, in an embodiment, for example, the first TFT T1 may function as a switching TFT, and the second TFT T2 may function as a driving TFT. Two TFTs are illustrated in FIG. 4A. However, as described above, the number of TFTs provided in one pixel circuit PC may be three or more.

In the following, for conciseness of description, the first and second semiconductor layers A1, A2 will be collectively referred to as semiconductor layers, the first and second gate electrode layers G1, G2 will be collectively referred to as gate electrodes, the first source electrode (not illustrated) and the second source electrode S2 will be collectively referred to as source electrodes, and the first and second drain electrodes D1 and D2 will be collectively referred to as drain electrodes.

The semiconductor layers A1, A2 may include polysilicon. According to some embodiments, the semiconductor layers A1, A2 may include amorphous silicon. According to some embodiments, the semiconductor layers A1, A2 may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layers A1, A2 may include a channel region, and a source region and a drain region on both sides of the channel region. For example, the source region and the drain region may be doped with impurities, and the impurities may include N-type impurities or P-type impurities. The source region and the drain region may be changed with each other according to characteristics of the transistor.

The gate electrode layers G1, G2 may be on the semiconductor layers A1, A2, respectively. The gate electrode layers G1, G2 may include a low-resistance conductive material such as molybdenum (Mo), aluminum (Al), copper (Cu), and/or titanium (Ti), and may have a single-layer or multilayer structure including the above-described material.

A first gate insulating layer 112 may be between the semiconductor layers A1, A2 and the gate electrode layers G1, G2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), and may have a single-layer or multilayer structure including the above-described material A second gate insulating layer 113 may cover the gate electrode layers G1, G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), and may have a single-layer or multilayer structure including the above-described material According to an embodiment, a first electrode CE1 of the storage capacitor Cap may overlap the first TFT T1. For example, the first gate electrode layer G1 of the first TFT T1 may function as the first electrode CE1 of the storage capacitor Cap.

A second electrode CE2 of the storage capacitor Cap may be arranged to overlap the first electrode CE1 with the second gate insulating layer 113 between the second electrode CE2 and the first electrode CE1. In this case, the second gate insulating layer 113 may function as a dielectric layer of the storage capacitor Cap. The second electrode CE2 may include a conductive material such as aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may have a single-layer or multilayer structure including the above-described material. For example, the second electrode CE2 may have a single-layer structure of molybdenum (Mo) or a multilayer structure of molybdenum (Mo)/aluminum (Al)/molybdenum (Mo). FIG. 4A illustrates that the cross-sectional size of the second electrode CE2 is less than the cross-sectional size of the first gate electrode layer G1. In an embodiment, the cross-sectional size of the second electrode CE2 is greater than or equal to the cross-sectional size of the first gate electrode layer G1.

An interlayer insulating layer 114 may cover the second electrode CE2 of the storage capacitor Cap. The interlayer insulating layer 114 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), and may have a single-layer or multilayer structure including the above-described material Contact holes CNT that at least partially expose the semiconductor layers A1, A2 and the gate electrode layers G1, G2, respectively, may be formed in the above-described insulating layers. For example, a first contact hole CNT1 exposing a portion of the drain region of the first semiconductor layer A1, a third contact hole CNT3 exposing a portion of the drain region of the second semiconductor layer A2, and a fourth contact hole CNT4 exposing a portion of the source region of the second semiconductor layer A2 may be formed in the first gate insulating layer 112, the second gate insulating layer 113, and the interlayer insulating layer 114. Of course, although not illustrated in FIG. 4A, a contact hole exposing a portion of the source region of the first semiconductor layer A1 may also be formed. Also, a second contact hole CNT2 exposing a portion of the gate electrode layer G1 may be formed in the second gate insulating layer 113 and the interlayer insulating layer 114. Of course, although not illustrated in FIG. 4A, a contact hole exposing a portion of the gate electrode layer G2 may be also formed in the second gate insulating layer 113 and the interlayer insulating layer 114.

Groove portions GP connected to at least one contact hole CNT may be formed in the interlayer insulating layer 114. For example, a first groove portion GP1 connected to the second contact hole CNT2 and the third contact hole CNT3, and a second groove portion GP2 connected to the fourth contact hole CNT4 may be formed in the interlayer insulating layer 114. Unlike the contact hole CNT, the groove portion GP may be a portion that does not pass through the interlayer insulating layer 114. That is, the groove portion GP may be a portion that is formed by partially removing the interlayer insulating layer 114 from the upper surface of the interlayer insulating layer 114 in a thickness direction.

Hereinafter, referring to FIGS. 4A and 4B together, a conductive layer CL may be positioned in the contact holes CNT according to an embodiment. The conductive layer CL may also be positioned in the groove portions GP. The conductive layer CL may include a stack structure of a first layer L1 and a second layer L2 positioned on the first layer L1.

For example, a first portion CLa, a second portion CLb, a third portion CLc, and a fourth portion CLd of the conductive layer CL may be positioned in the first contact hole CNT1, the second contact hole CNT2, the third contact hole CNT3, and the fourth contact hole CNT4, respectively. A fifth portion CLe of the conductive layer CL may be positioned in the first groove portion GP1, and the sixth portion CLf of the conductive layer CL may be positioned in the second groove portion GP2.

The first portion CLa of the conductive layer CL may include a stack structure of a first portion L1a of the first layer L1 and a first portion L2a of the second layer L2. The second portion CLb of the conductive layer CL may include a stack structure of a second portion L1b of the first layer L1 and a second portion L2b of the second layer L2. The third portion CLc of the conductive layer CL may include a stack structure of a third portion L1c of the first layer L1 and a third portion L2c of the second layer L2. The fourth portion CLd of the conductive layer CL may include a stack structure of a fourth portion L1d of the first layer L1 and a fourth portion L2d of the second layer L2. Also, the fifth portion CLe of the conductive layer CL may include a stack structure of a fifth portion L1e of the first layer L1 and a fifth portion L2e of the second layer L2. The sixth portion CLf of the conductive layer CL may include a stack structure of a sixth portion L1f of the first layer L1 and a sixth portion L2f of the second layer L2.

As such, because the conductive layer CL is positioned in the contact holes CNT and the groove portions GP, an upper surface CL-S of the conductive layer CL may form a flat surface with an upper surface 114S of the interlayer insulating layer 114.

According to an embodiment, the first layer L1 and the second layer L2 of the conductive layer CL may include different materials from each other, and both the first layer L1 and the second layer L2 may include a conductive material. For example, the first layer L1 of the conductive layer CL may include a transparent conductive layer such as indium tin oxide (ITO) and indium zinc oxide (IZO). The second layer L2 of the conductive layer CL may include a conductive material such as molybdenum (Mo), aluminum (Al), copper (Cu), and titanium (Ti).

According to an embodiment, the first layer L1 of the conductive layer CL may be in direct contact with the inner surfaces of the contact holes CNT or the inner surfaces of the groove portions GP. The second layer L2 of the conductive layer CL is formed on the first layer L1, and thus may not be in direct contact with the inner surfaces of the contact holes CNT or the inner surfaces of the groove portions GP.

The second layer L2 of the conductive layer CL may be electrically connected to the semiconductor layers A1, A2 or the gate electrode layers G1, G2 through the first layer L1. For example, the first portion L2a of the second layer L2 of the conductive layer CL may be electrically connected to the drain region of the first semiconductor layer A1 through the first portion L1a of the first layer L1. The second portion L2b of the second layer L2 of the conductive layer CL may be electrically connected to the first gate electrode layer G1 through the second portion L1b of the first layer L1. The third portion L2c of the second layer L2 of the conductive layer CL may be electrically connected to the drain region of the second semiconductor layer A2 through the third portion L1c of the first layer L1. The fourth portion L2d of the second layer L2 of the conductive layer CL may be electrically connected to the source region of the first semiconductor layer A1 through the fourth portion L1d of the first layer L1.

According to an embodiment, the conductive layer CL may include the source electrodes and the drain electrodes of the TFTs and the data lines DL. For example, the first portion CLa of the conductive layer CL may function as the first drain electrode D1, and the second portion CLb of the conductive layer CL may function as a connection electrode CM that bridges between the first gate electrode layer G1 and the second semiconductor layer A2. The third portion CLc and the fourth portion CLd of the conductive layer CL may function as the second drain electrode D2 and the second source electrode S2, respectively. Of course, although not illustrated in FIGS. 4A and 4B, a portion of the conductive layer CL may function as the first source electrode (not illustrated) connected to the source region of the first semiconductor layer A1. Also, the fifth portion CLe of the conductive layer CL may function as a bridge electrode BE that bridges between the first gate electrode layer G1 and the second semiconductor layer A2 together with the connection electrode CM. The bridge electrode BE may be integrally formed with the connection electrode CM and the second drain electrode D2. The sixth portion CLf of the conductive layer CL may function as the data line DL.

A planarization insulating layer 115 may be on the interlayer insulating layer 114 and the conductive layer CL and cover the pixel circuit PC. The organic light-emitting diode OLED may be positioned on the planarization insulating layer 115 as a light-emitting element.

The planarization insulating layer 115 may provide a flat upper surface so that a pixel electrode 210 of the organic light-emitting diode OLED is formed to be flat. According to an embodiment, the planarization insulating layer 115 may include an organic insulating material. For example, the planarization insulating layer 123 may include a general-purpose polymer, e.g., benzocyclobutene (BCB), polyimide, hexamethyldisiloxane (HMDSO), polymethylmethacrylate (PMMA), or polystyrene (PS), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, or any blend thereof. The planarization insulating layer 115 may have a single-layer or multilayer structure including the above-described material.

According to an embodiment, the planarization insulating layer 115 may include an inorganic insulating material. For example, the planarization insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). When the planarization insulating layer 115 includes an inorganic insulating material, chemical planarization polishing may be performed in some cases. The planarization insulating layer 115 may include both of an organic material and an inorganic material.

As described above, the organic light-emitting diode OLED may be on the planarization insulating layer 115. The organic light-emitting diode OLED may include the pixel electrode 210, an intermediate layer 220 including an organic emission layer, and an opposite electrode 230.

A through hole TH exposing a portion of the conductive layer CL may be formed in the planarization insulating layer 115, and the pixel electrode 210 of the organic light-emitting diode OLED may be connected to a portion of the conductive layer CL through the through hole TH. A portion of the conductive layer CL is, for example, the first portion CLa of the conductive layer CL, as illustrated in FIGS. 4A and 4B, and may be the first drain electrode D1 of the first TFT T1. That is, the pixel electrode 210 may be electrically connected to the first drain electrode D1 through the through hole TH, and thus may be electrically connected to the first TFT T1. As another example, the through hole TH may expose the first source electrode S1 of the first TFT T1, and the pixel electrode 210 may be connected to the first source electrode S1, and thus may be electrically connected to the first TFT T1.

The pixel electrode 210 may include a (semi)transmissive electrode or a reflective electrode. According to some embodiments, the pixel electrode 210 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or any compound thereof, and a transparent or semitransparent electrode layer formed on the reflective layer. The transparent or semitransparent electrode layer may include at least one selected from indium tin oxide (ITO), indium zinc oxide (IZO), zinc oxide (ZnO), indium oxide ($In_2O_3$), indium gallium oxide (IGO), or aluminum zinc oxide (AZO).

A pixel defining layer 117 may be on the pixel electrode 210. The pixel defining layer 117 may cover an edge of the pixel electrode 210 and include an opening overlapping a central portion of the pixel electrode 210.

The pixel defining layer 117 may prevent an electric arc or the like from occurring on the edge of the pixel electrode 210 by increasing the distance between the edge of the pixel electrode 210 and the opposite electrode 230 on the pixel electrode 210. The pixel defining layer 117 may be formed through spin coating or the like by using an organic insulating material such as polyimide, polyamide, acrylic resin, benzocyclobutene, hexamethyldisiloxane (HMDSO), and phenol resin.

The intermediate layer 220 corresponding to the pixel electrode 210 may be on the pixel defining layer 117. The intermediate layer 220 may include an organic emission layer. The organic emission layer may include an organic material including a fluorescent material or a phosphorescent material that emits red light, green light, blue light, or white light. The organic emission layer may include a low molecular weight organic material or a high molecular weight organic material. A hole transport layer (HTL), a hole injection layer (HIL), an electron transport layer (ETL), an electron injection layer (EIL), and the like may be optionally further arranged below and above the organic emission layer. FIG. 4A illustrates an example in which the intermediate layer 220 is formed to correspond to one pixel electrode 210. However, as another example, the intermediate layer 220 may be variously modified. For example, the intermediate layer 220 may include an integrated layer over the pixel electrodes 210.

The opposite electrode 230 may be on the intermediate layer 220 and the pixel defining layer 117. The opposite electrode 230 may include a transmissive electrode or a reflective electrode. According to some embodiments, the opposite electrode 230 may be a transparent or semitransparent electrode, and may include a metal thin-film having a low work function, including silver (Ag), magnesium (Mg), aluminum (Al), nickel (Ni), chromium (Cr), lithium (Li), calcium (Ca), and any compound thereof. Also, a transparent conductive oxide (TCO) layer such as ITO, IZO, ZnO, or $In_2O_3$ may be further on the metal thin-film. The opposite electrode 230 may be integrally formed to completely cover the display area DA, and may correspond to the pixel electrodes 210.

As described above, the stack structure of the pixel electrode 210, the intermediate layer 220, and the opposite electrode 230 may form the organic light-emitting diode OLED as the light-emitting element, and an emission area of the organic light-emitting diode OLED may be defined as a pixel PX. Because an opening 1170P of the pixel defining layer 117 defines the size and/or width of the emission area, the size and/or width of the pixel PX may depend on the size and/or width of the corresponding opening 1170P of the pixel defining layer 117.

The peripheral area PA in FIG. 4A is illustrated centering on the area in which the pad electrode layer 50 is formed. Referring to the peripheral area PA on the substrate 100, the buffer layer 111 and the first gate insulating layer 112 may be on the substrate 100, and the pad electrode layer 50 may be on the first gate insulating layer 112. The pad electrode layer 50 may be exposed without being covered with the second gate insulating layer 113, the interlayer insulating layer 114, and/or the planarization insulating layer 115. In this manner, the pad electrode layer 50 may be in contact with the display circuit board, e.g., see display circuit board 30 of FIG. 2.

According to an embodiment, the pad electrode layer 50 may include the same material as that of the gate electrode layers G1, G2 positioned in the display area DA. The pad electrode layer 50 and the gate electrode layers G1, G2 may be formed by the same process. For example, the pad electrode layer 50 may include a low-resistance conductive material such as molybdenum (Mo), aluminum (Al), copper (Cu), and/or titanium (Ti), and may include a single-layer or multilayer structure including the above-described material. Because the pad electrode layer 50 includes a low-resistance conductive material, the delay of an electric signal transmitted through the pad electrode layer 50 may be minimized.

According to an embodiment, the pad electrode layer 50 may include a material different from that of the first layer L1. According to an embodiment, the pad electrode layer 50 and the first layer L1 may include different materials from each other, so that the etch selectivity of the pad electrode layer 50 is different from the etch selectivity of the first layer L1. The reasons for this will be described later with reference to FIG. 5J.

FIGS. 5A to 5L are cross-sectional views schematically illustrating a part of a process of manufacturing a display device, according to an embodiment. The cross-sections of FIGS. 5A to 5L may correspond to the cross-section of FIG. 4A.

Figure 5A:
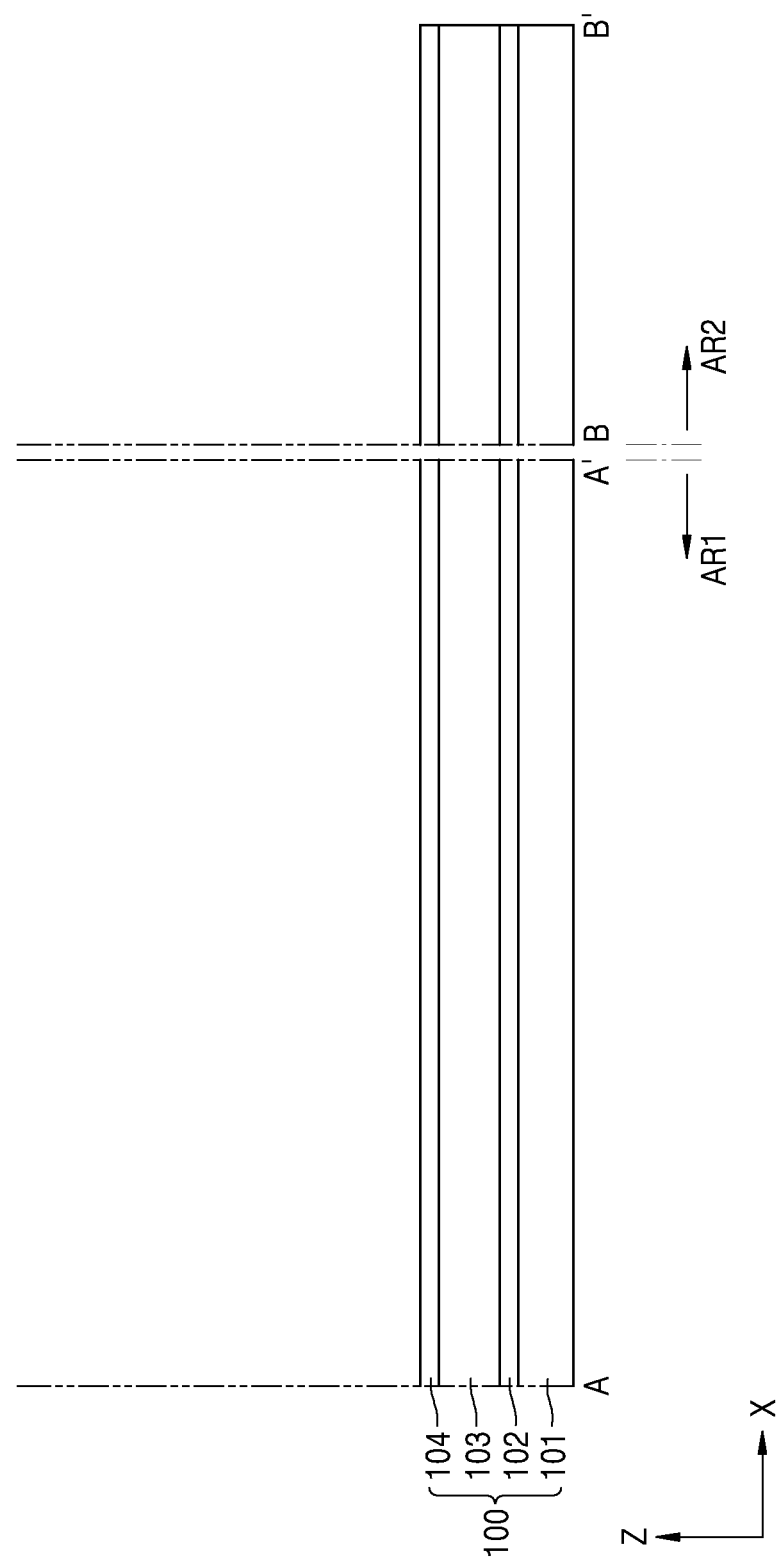

Referring to FIG. 5A, a substrate 100, which includes a first area AR1 and a second area AR2 surrounding at least a portion of the first area AR1, may be prepared. The first area AR1 of the substrate 100 may correspond to the display area, e.g., see the display area DA of FIG. 4A, of the display device, e.g., see the display device 1 of FIG. 4A, and the second area AR2 of the substrate 100 may correspond to the peripheral area, e.g., see the peripheral area PA of FIG. 4A, of the display device, e.g., see the display device 1 of FIG. 4A.

Because the substrate 100 includes the stack structure of the first base layer 101, the first barrier layer 102, the second base layer 103, and the second barrier layer 104 as described above, a first base layer 101, a first barrier layer 102, a second base layer 103, and a second barrier layer 104 may be sequentially formed.

Figure 5B:
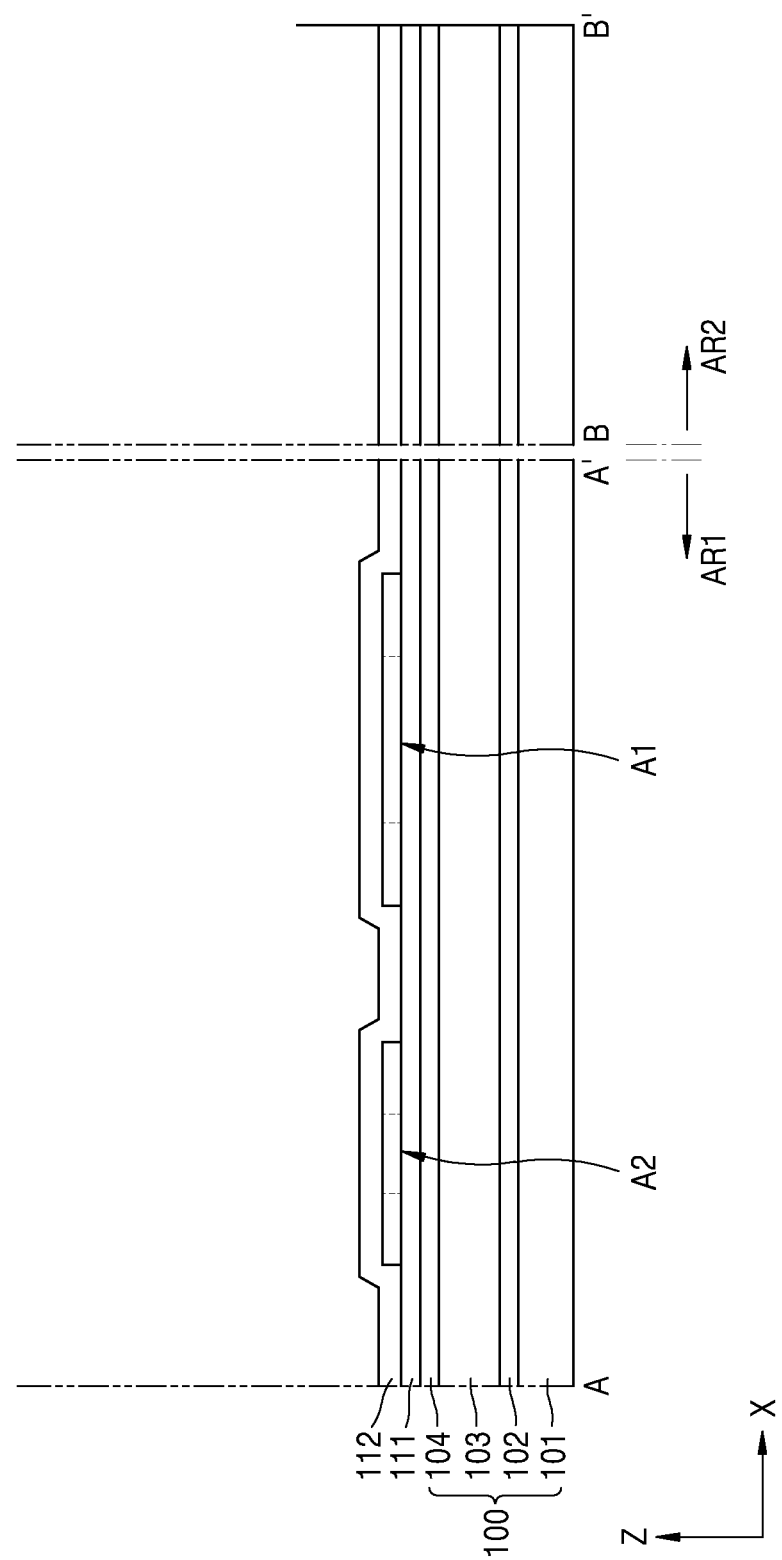

Referring to FIG. 5B, a buffer layer 111 may be formed on the substrate 100 and may be formed to correspond to both the first area AR1 and the second area AR2. The buffer layer 111 may be formed through a vapor deposition method such as chemical vapor deposition (CVD), thermochemical vapor deposition (TCVD), or plasma enhanced chemical vapor deposition (PECVD).

Semiconductor layers A1, A2 may be formed in the first area AR1 on the buffer layer 111. Because the second area AR2 corresponds to the peripheral area PA, the semiconductor layers A1, A2 may not be formed in the second area AR2. The semiconductor layers A1, A2 may be formed through a deposition process using the aforementioned deposition method, a photolithography process, an etching process, and an impurity doping process.

A first gate insulating layer 112 covering the semiconductor layers A1, A2 may be formed to correspond to both the first area AR1 and the second area AR2. The first gate insulating layer 112 may be formed through, for example, the deposition method.

Figure 5C:
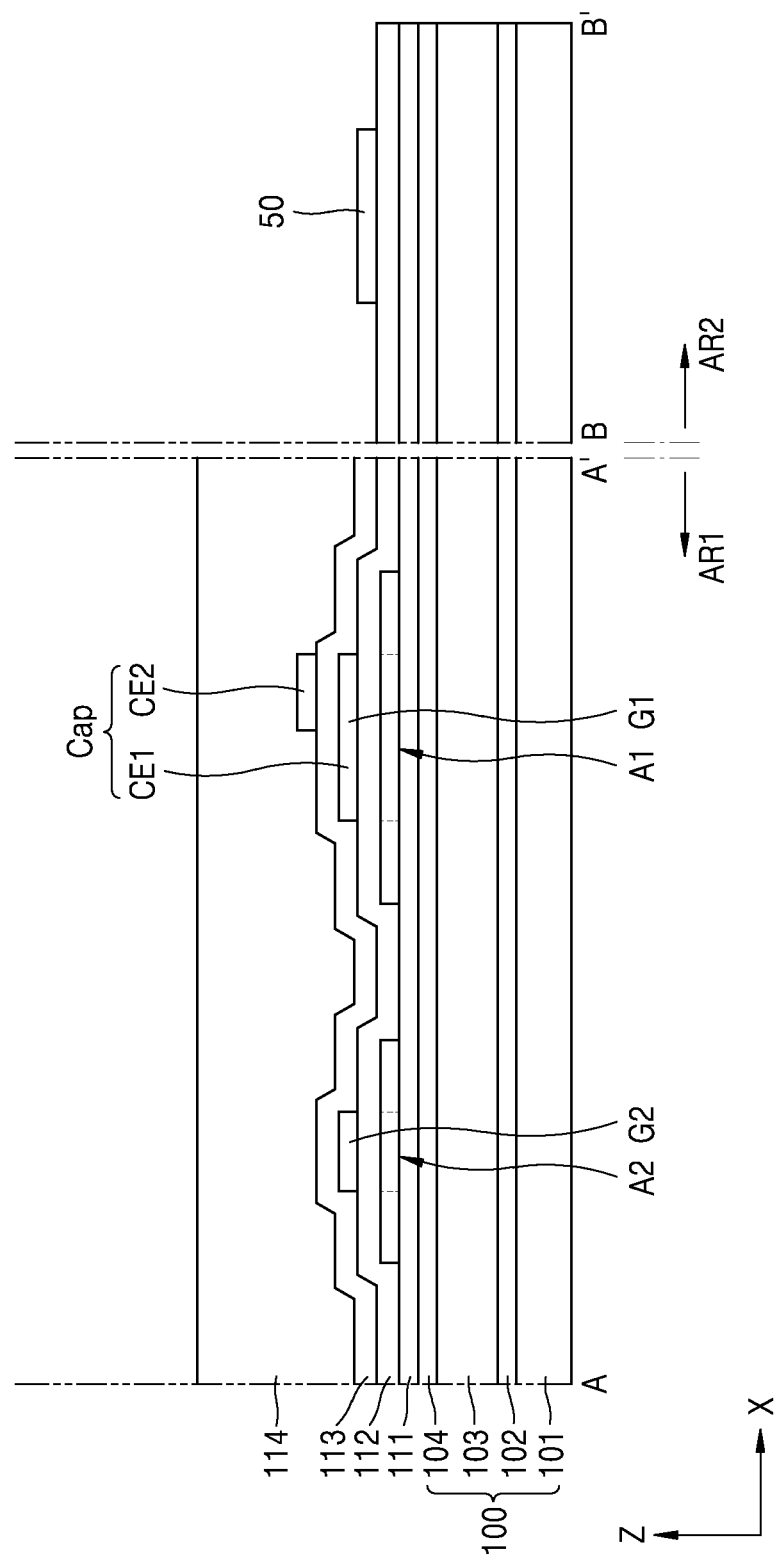

Referring to FIG. 5C, first and second gate electrode layers G1, G2 may be formed in the first area AR1 on the first gate insulating layer 112. The first gate electrode layer G1 and the second gate electrode layer G2 may be formed to at least partially overlap the first semiconductor layer A1 and the second semiconductor layer A2, respectively. The first and second gate electrode layers G1, G2 may be formed through, for example, a deposition process using a deposition method such as CVD, TCVD, PECVD, sputtering, or e-beam evaporation, a photolithography process, and an etching process.

According to an embodiment, the pad electrode layer 50 may be formed in the second area AR2 on the first gate insulating layer 112. The pad electrode layer 50 and the first and second gate electrode layers G1, G2 may be formed together through the same process.

A second gate insulating layer 113 covering the first and second gate electrode layers G1, G2 may be formed. A second electrode CE2 of a storage capacitor Cap may be formed in the first area AR1 on the second gate insulating layer 113. Then, an interlayer insulating layer 114 covering the second electrode CE2 may be formed. According to an embodiment, the second gate insulating layer 113 and the interlayer insulating layer 114 may be formed to expose the pad electrode layer 50 without covering the pad electrode layer 50. The second gate insulating layer 113 and the interlayer insulating layer 114 may be formed through, for example, a deposition method such as CVD, TCVD, or PECVD.

Figure 5D:
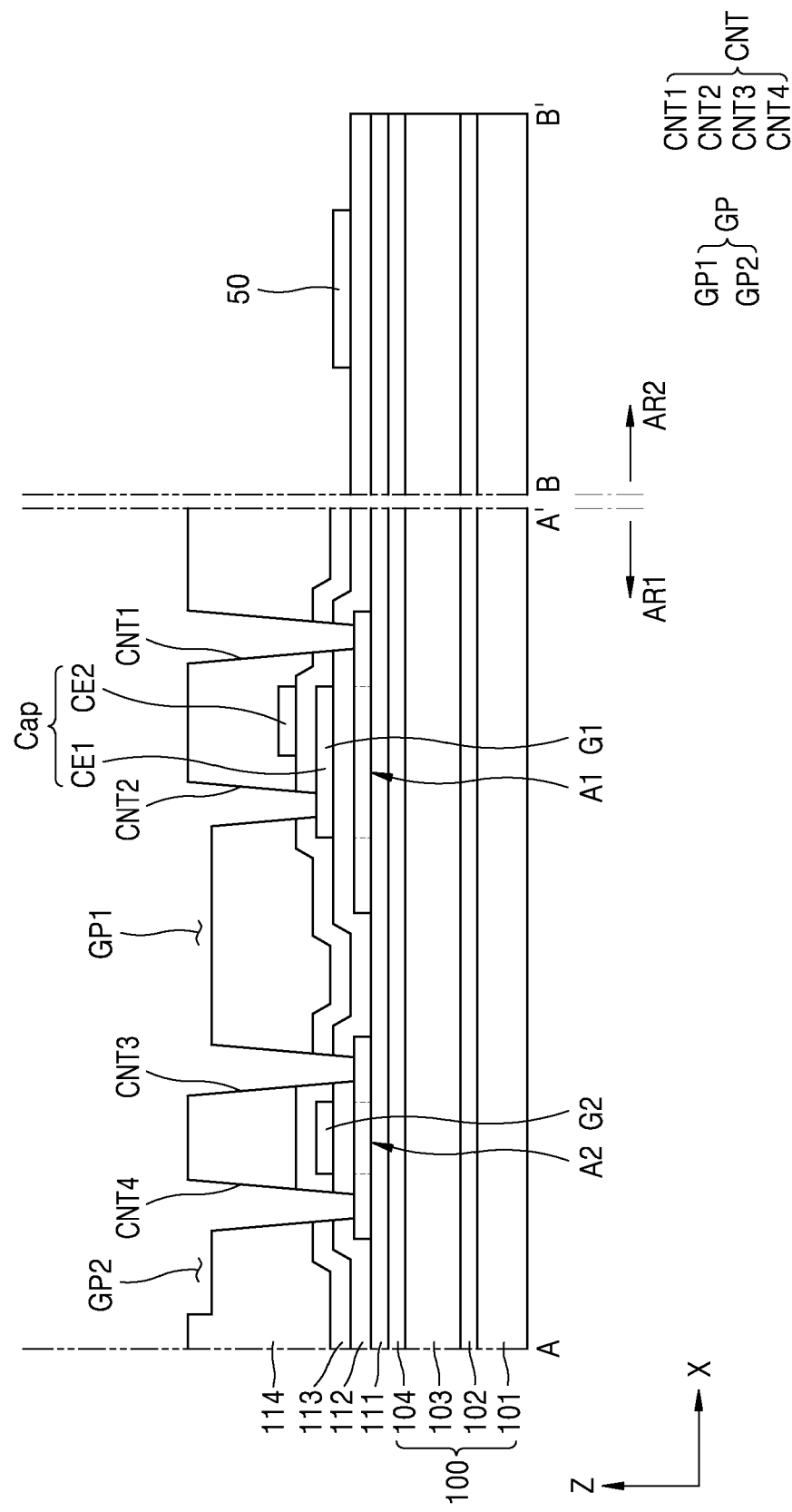

Referring to FIG. 5D, contact holes CNT that at least partially expose each of the semiconductor layers A1, A2 and the first and second gate electrode layers G1, G2 may be formed. Also, groove portions GP may be formed together with the contact holes CNT. A photolithography process using a half-tone mask and an etching process may be used to form the contact holes CNT and the groove portions GP. The photolithography process may use a negative photoresist or a positive photoresist. However, for convenience of description, a photolithography process using a negative photoresist will be described below.

The half-tone mask may be divided into a transmission area through which light is transmitted, a semi-transmission area through which light is partially transmitted, and a blocking area that blocks light transmission according to light transmittance.

When a negative photoresist is applied on an insulating layer and the negative photoresist is light-exposed through a half-tone mask and developed, a first portion of the negative photoresist corresponding to a transmission area of the half-tone mask is not removed and remains in a thick thickness. A second portion of the negative photoresist corresponding to a semi-transmission area of the half-tone mask is partially removed according to the exposure amount and remains in a thin thickness. On the other hand, a third portion of the negative photoresist corresponding to a blocking area of the half-tone mask is not light-exposed and is thus removed.

When the insulating layer, e.g., formed of layers 112, 113, 114, is etched using the photoresist pattern thus formed as an etching mask, contact holes CNT may be formed in an area corresponding to the third portion of the negative photoresist. When the photoresist pattern is removed by at least the thickness of the second portion using an ashing process or the like, and then, the insulating layer is etched again, groove portions GP may be formed in an area corresponding to the second portion of the negative photoresist.

Figure 5E:
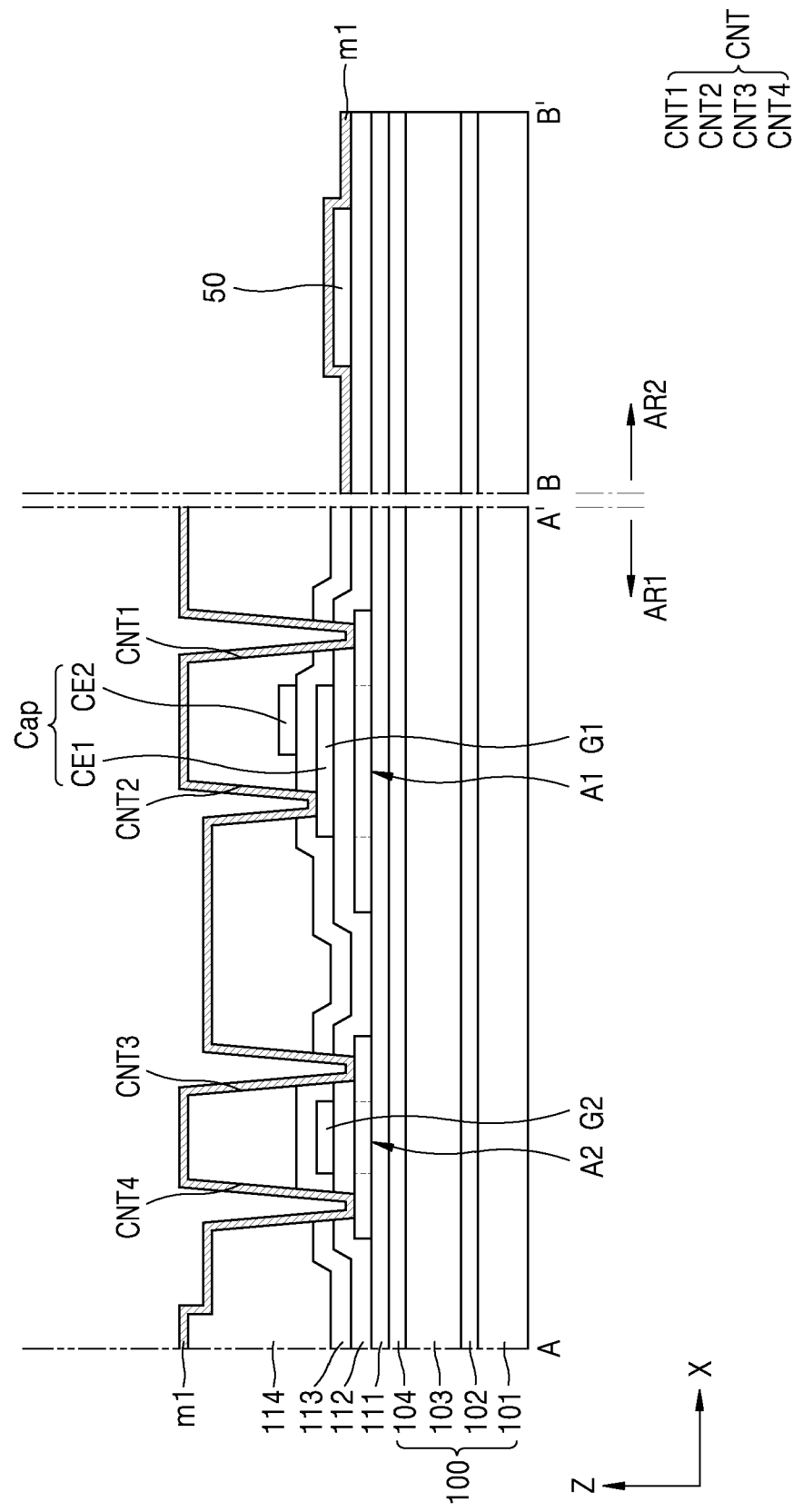

Referring to FIG. 5E, a first layer material m1 may be formed to cover the interlayer insulating layer 114, the contact holes CNT, and the groove portions GP of the first area AR1 and cover the first gate insulating layer 112 and the pad electrode layer 50 in the second area AR2. The first layer material m1 is a material for forming the first layer L1 of the conductive layer CL, and may include a transparent conductive film such as indium tin oxide (ITO) and indium zinc oxide (IZO). The first layer material m1 may be formed by, for example, spin coating.

Figure 5F:
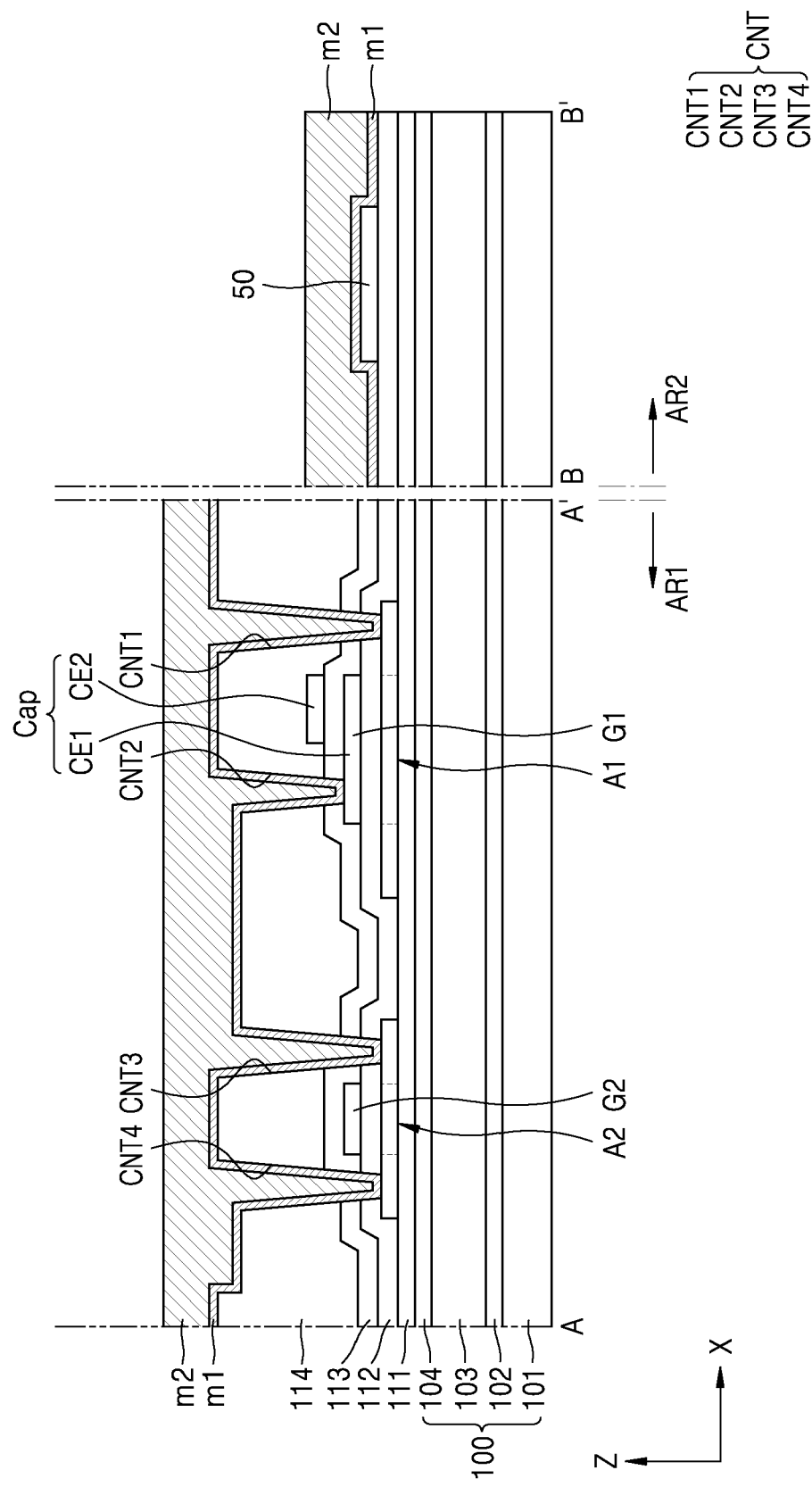

Referring to FIG. 5F, a second layer material m2 may be formed to cover the first layer material m1 in the first area AR1 and the second area AR2. The second layer material m2 is a material for forming the second layer L2 of the conductive layer CL, and may include a conductive material such as molybdenum (Mo), aluminum (Al), copper (Cu), and titanium (Ti). The second layer material m2 may be formed through, for example, a deposition method such as CVD, TCVD, PECVD, sputtering, or e-beam evaporation. The second layer material m2 may be formed to have a considerable thickness so as to fill the inside of each of the contact holes CNT and the groove portions GP.

Figure 5G:
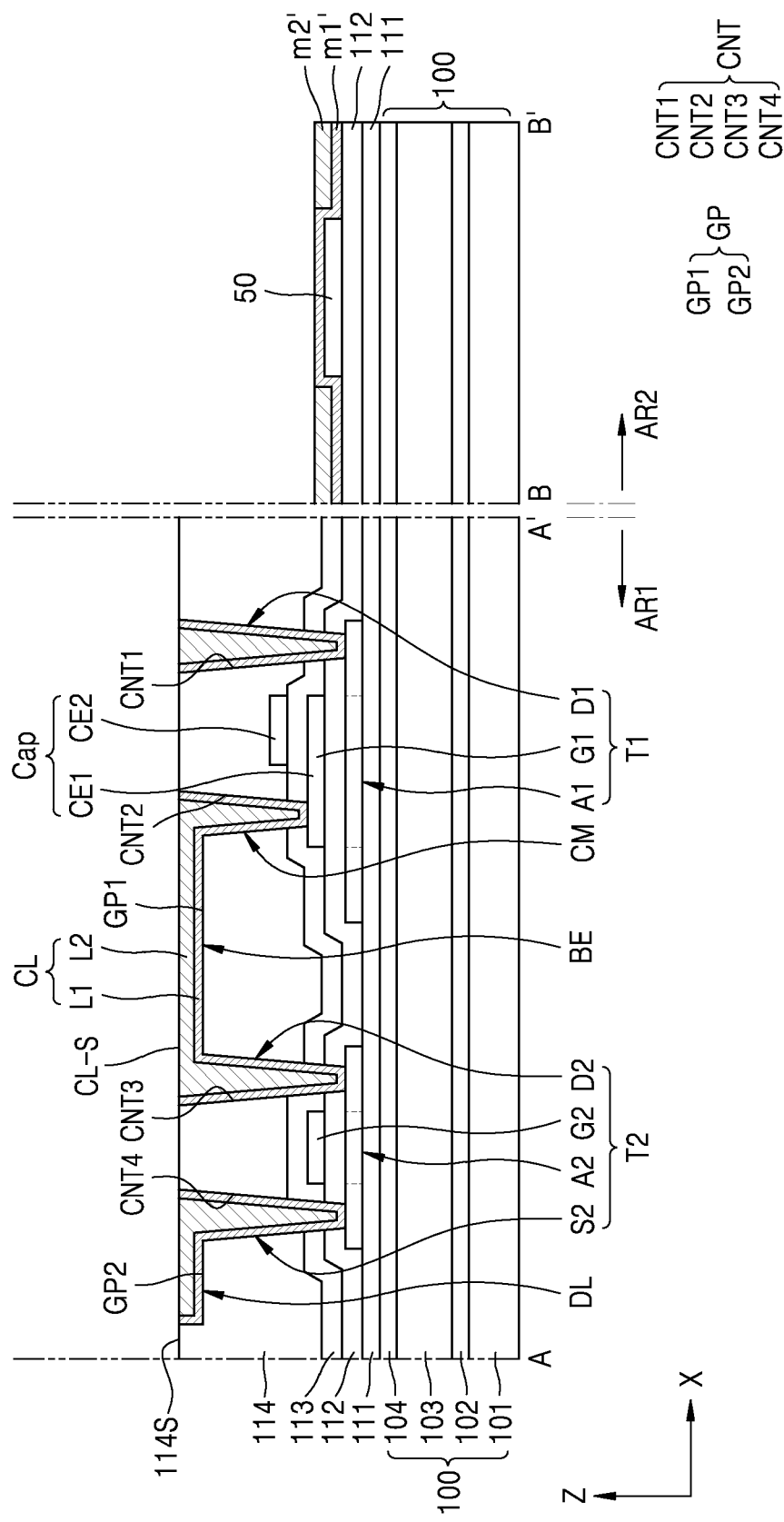

Referring to FIG. 5G, a portion of the first layer material m1 and a portion of the second layer material m2 may be removed so that the interlayer insulating layer 114 is exposed. In this case, portions of the first layer material m1 and the second layer material m2 of the first are AR1, which are positioned inside the contact holes CNT and the groove portions GP, may not be removed. In this manner, a conductive layer CL including drain electrodes D1 and D2, a second source electrode S2, a bridge electrode BE, a connection electrode CM, and a data line DL may be formed in the first area AR1.

According to an embodiment, a portion of the first layer material m1 and a portion of the second layer material m2 may be removed through a polishing process, for example, chemical mechanical polishing (CMP). An exposed upper surface 114S of the interlayer insulating layer 114 may form a flat surface with an upper surface CL-S of the conductive layer CL positioned inside the contact holes CNT and the groove portions GP. That is, the upper surface 114S of the interlayer insulating layer 114 may form a flat surface having no height difference together with the upper surfaces of the drain electrodes D1 and D2, the upper surfaces of the second source electrode S2, the upper surface of the bridge electrode BE, the upper surface of the connection electrode CM, and the upper surface of the data line DL.

As a comparative example, when a conductive layer is placed on an upper surface of an interlayer insulating layer, the thickness of the conductive layer may cause a height difference between the upper surface of the conductive layer and the upper surface of the interlayer insulating layer. Also, as the stack structure under the conductive layer for forming the pixel circuit becomes more complicated and the number of layers to be stacked increases, the step difference may further increase. Even when the planarization insulating layer covering the conductive layer is formed on the interlayer insulating layer, the degree of planarization of the upper surface of the planarization insulating layer may be adversely affected as the step difference increases. Due to this, irregularities or height difference may occur in the pixel electrode on the planarization insulating layer. This may cause white angle difference (WAD), or may cause optical characteristics of the organic light-emitting diode or the display quality of the display device to be deteriorated. The WAD refers to a phenomenon in which white color coordinates of the display device varies depending on a viewing angle of an observer.

However, according to an embodiment, because the conductive layer CL is formed in the contact holes CNT or the groove portions GP formed in the insulating layers, and the upper surface CL-S of the conductive layer CL and the upper surface 114S of the interlayer insulating layer 114 are planarized through the polishing process, the above-described problems caused by the height difference may be minimized. In this manner, a method of manufacturing a display device with improved display quality may be provided.

The above-described polishing process may be performed on the entire area above the substrate 100, and a portion of the first layer material m1 and/or a portion of the second layer material m2 positioned in the second area AR2 may also be removed. However, even when the polishing process is performed on the entire area above the substrate 100, a remaining portion m1' of the first layer material m1 and a remaining portion m2' of the second layer material m2 may be present in the second area AR2 due to the height difference between the first area AR1 and the second area AR2.

As a comparative example, when the first layer material m1 does not cover the pad electrode layer 50, for example, as the polishing process is performed, the pad electrode layer 50 may be exposed to a polishing agent and damaged.

However, according to an embodiment, the first layer material m1 is formed to cover the pad electrode layer 50, and the remaining portion m1' of the first layer material m1 positioned in the second area AR2 still covers the pad electrode layer 50 even during the polishing process. Accordingly, the pad electrode layer 50 may not be exposed to the polishing agent. Thus, damage to the pad electrode layer 50 due to the polishing process may be minimized, and the manufacturing quality of the display device may be improved.

Figure 5H:
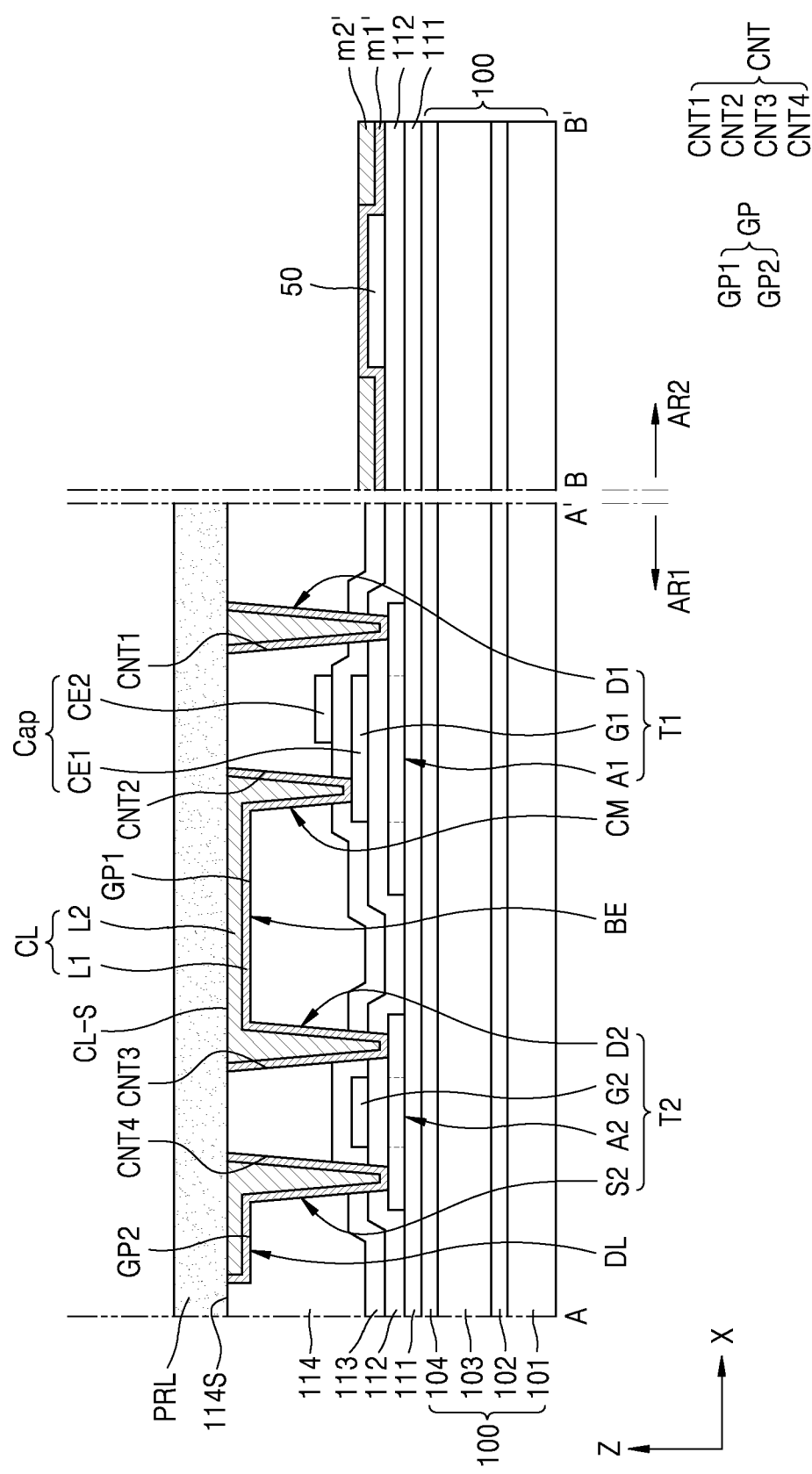

Referring to FIG. 5H, the remaining portion m1' of the first layer material m1 and the remaining portion m2' of the second layer material m2 positioned in the second area AR2 may be removed. Specifically, the remaining portion m1' of the first layer material m1 and the remaining portion m2' of the second layer material m2 may be removed through an etching process. To this end, a photoresist layer PRL covering the interlayer insulating layer 114 and the conductive layer CL may be formed in the first area AR1. The photoresist layer PRL may not be formed in the second area AR2 and may expose the second area AR2. The photoresist layer PRL may protect the conductive layer CL so that the conductive layer CL is not removed by an etching solution or an etching gas. Photoresist coating, exposure, and development processes may be used to form the photoresist layer PRL.

Figure 5I:
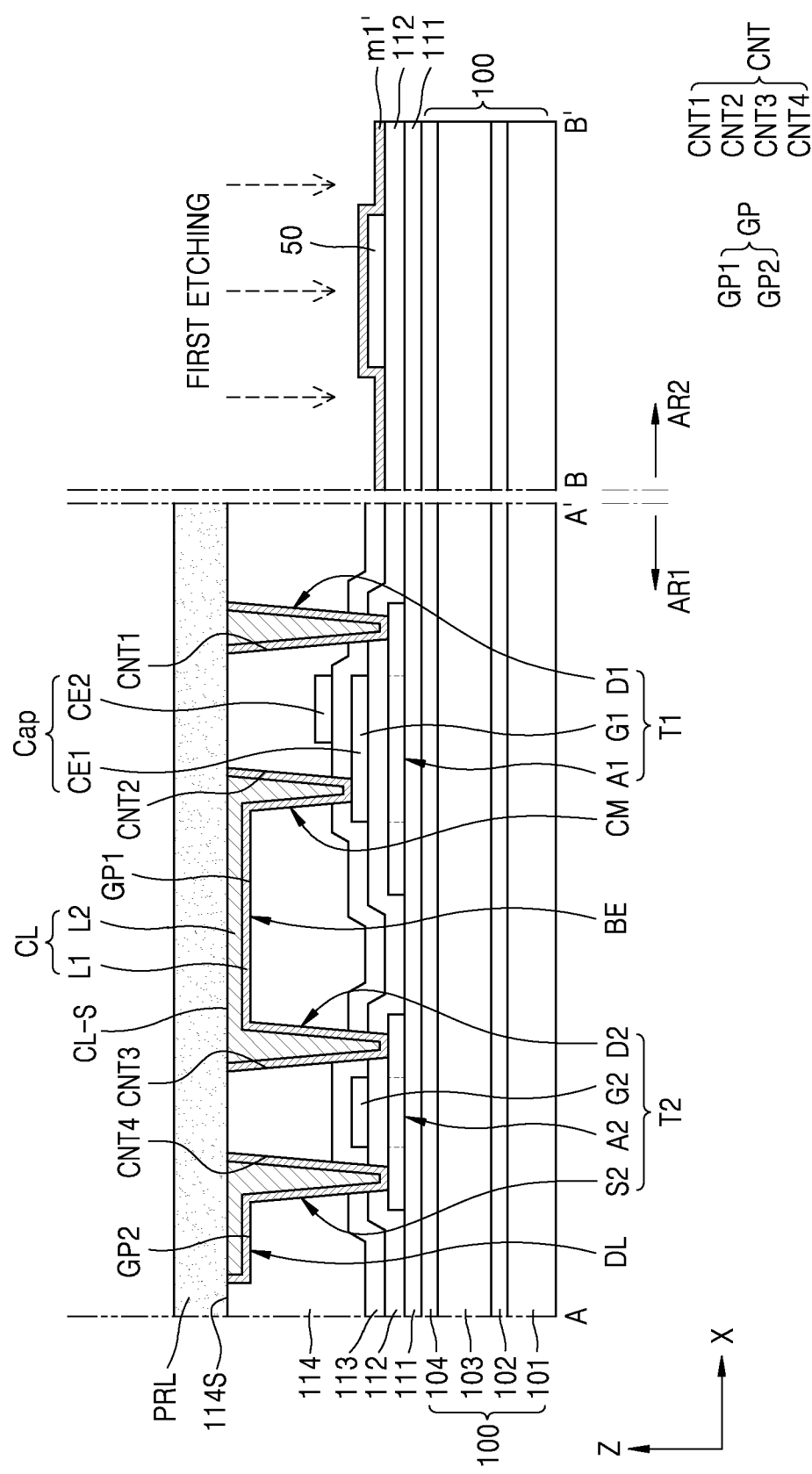

Referring to FIG. 5I, the remaining portion m2' of the second layer material m2 in the second area AR2 may be etched by using the photoresist layer PRL as an etching mask, e.g., a first etching. As the etching, wet etching or dry etching may be used.

Referring to FIG. 5J, the remaining portion m1' of the first layer material m1 in the second area AR2 may be etched by using the photoresist layer PRL as an etching mask, e.g., a second etching. As the etching, wet etching or dry etching may be used. For example, the etching solution or the etching gas used in the second etching may be the same as or different from the etching solution or the etching gas used in the first etching.

At this time, the remaining portion m1' of the first layer material m1 is etched, but in order not to damage the pad electrode layer 50 due to the etching, the pad electrode layer 50 may include a material different from that of the remaining portion m1' of the first layer material m1. According to an embodiment, the pad electrode layer 50 and the remaining portion m1' of the first layer material m1 may include different materials from each other, so that the etch selectivity of the pad electrode layer 50 is different from the etch selectivity of the remaining portion m1' of the first layer material. Thus, the remaining portion m1' of the first layer material m1 may be removed by the etching without removing or damaging the pad electrode layer 50.

Figure 5K:
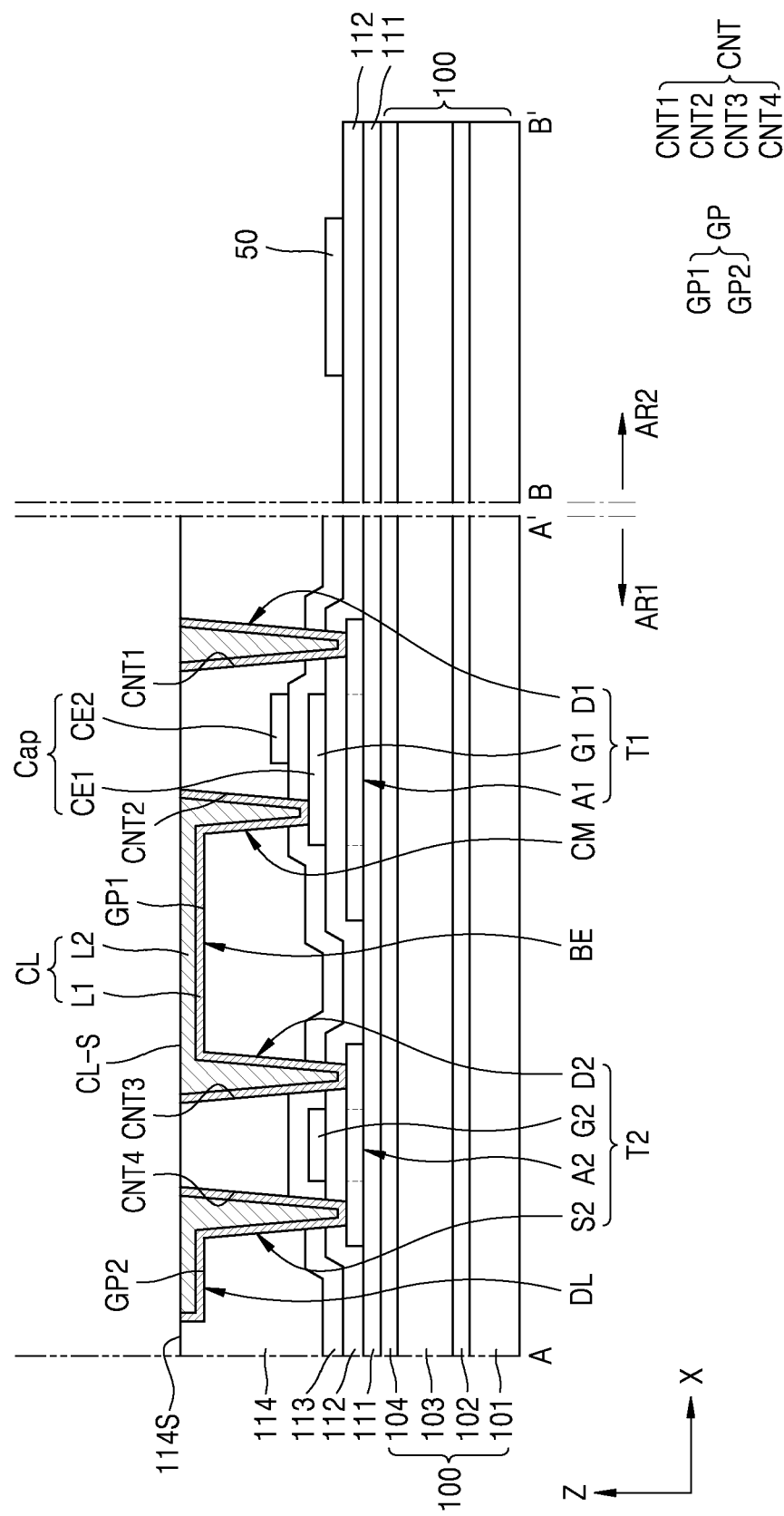

Referring to FIG. 5K, the photoresist layer PRL of the first area AR1 may be removed, and in this case, an ashing process or the like may be used.

Figure 5L:
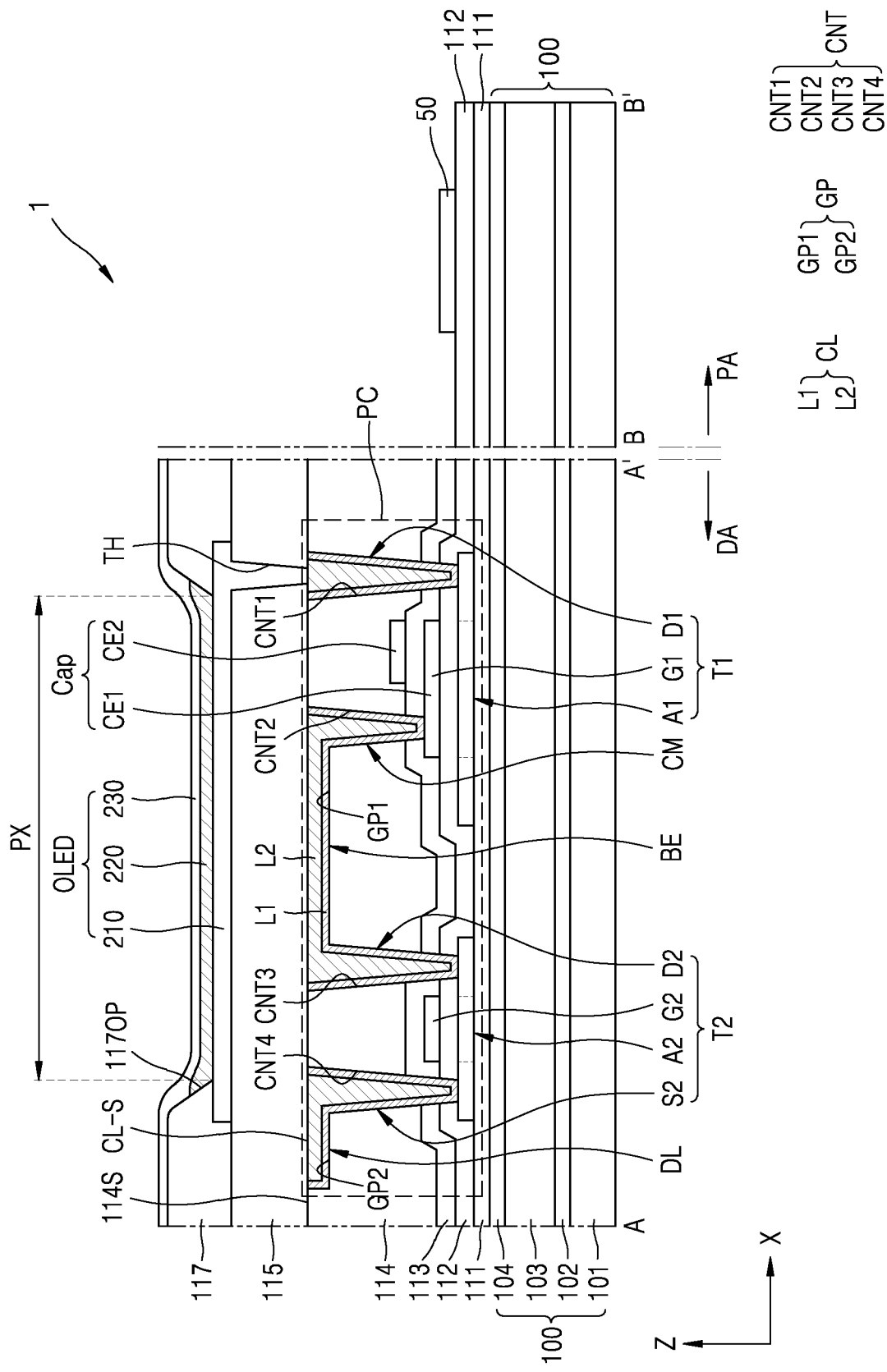

Referring to FIG. 5L, a planarization insulating layer 115 may be formed in the first area AR1 and a through hole TH may be formed in the planarization insulating layer 115. A pixel electrode 210, a pixel defining layer 117, an intermediate layer 220, and an opposite electrode 230 may be sequentially formed on the planarization insulating layer 115. In this manner, an organic light-emitting diode OLED connected to a portion of the conductive layer CL, e.g., the first drain electrode D1, through the through hole TH may be formed.

According to an embodiment, a flatter surface may be provided on the upper surface of the planarization insulating layer 115 on which the organic light-emitting diode OLED is arranged. This may improve display quality. Also, by using the first layer material m1 covering the pad electrode layer 50, damage to the pad electrode layer 50 that may occur during the polishing process on the interlayer insulating layer 114 may be prevented and the manufacturing quality may be improved.

According to one or more embodiments, the display quality may be improved by providing the flat surface on the upper surface of the insulating layer on which the light-emitting element is arranged. Also, the manufacturing quality may be improved by preventing damage to the pad electrode layer that may occur during some processes. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
preparing a substrate having a first area and a second area surrounding at least a portion of the first area;
forming a semiconductor layer in the first area on the substrate;
forming a first insulating layer covering the semiconductor layer;
forming a gate electrode layer that at least partially overlaps the semiconductor layer;
forming a pad electrode layer in the second area on the substrate;
forming a second insulating layer covering the gate electrode layer;
forming contact holes that at least partially expose the semiconductor layer and the gate electrode layer; and
forming a conductive layer positioned in the contact holes and comprising a first layer and a second layer, wherein the first layer and the second layer of the conductive layer comprise different materials from each other,
wherein the forming of the conductive layer comprises:
forming a first layer material covering the second insulating layer, the contact holes, and the pad electrode layer;
forming a second layer material covering the first layer material;
removing a portion of the first layer material and a portion of the second layer material to expose the second insulating layer; and
completely removing the first layer material and the second layer material positioned in the second area.

2. The method of claim 1, wherein the completely removing comprises etching a portion of each of the first layer material and the second layer material positioned in the second area.

3. The method of claim 2, wherein the etching of the portion of each of the first layer material and the second layer material positioned in the second area comprises:
forming a photoresist layer covering the second insulating layer and the conductive layer;

etching the portion of the second layer material positioned in the second area by using the photoresist layer as an etching mask; and etching the portion of the first layer material positioned in the second area by using the photoresist layer as an etching mask.

4. The method of claim 1, wherein the conductive layer comprises at least one of a source electrode of a thin-film transistor, a drain electrode of the thin-film transistor, and a data line.

5. The method of claim 1, wherein the second layer of the conductive layer is electrically connected to the semiconductor layer and the gate electrode layer through the first layer.

6. The method of claim 1, wherein the first layer of the conductive layer comprises indium tin oxide (ITO) or indium zinc oxide (IZO).

7. The method of claim 1, wherein an upper surface of the conductive layer forms a flat surface with an upper surface of the second insulating layer.

8. The method of claim 1, wherein the first layer of the conductive layer and the pad electrode layer comprise different materials from each other.

9. The method of claim 8, wherein an etching selectivity of the first layer of the conductive layer is different from an etching selectivity of the pad electrode layer.

10. The method of claim 1, wherein the gate electrode layer and the pad electrode layer comprise a same material and are formed by a same process.

11. The method of claim 1, wherein the pad electrode layer comprises at least one of molybdenum (Mo), aluminum (Al), copper (Cu), and titanium (Ti).

12. A method of manufacturing a display device, the method comprising:
preparing a substrate having a first area and a second area surrounding at least a portion of the first area;
forming a semiconductor layer in the first area on the substrate;
forming a pad electrode layer in the second area on the substrate;
forming at least one inorganic insulating layer covering the semiconductor layer;
forming a contact hole exposing at least a portion of the semiconductor layer in the at least one inorganic insulating layer;
forming a conductive layer positioned in the contact hole and having a first layer and a second layer, wherein the first layer and the second layer of the conductive layer comprise different materials from each other;
forming at least one organic insulating layer on the at least one inorganic insulating layer; and
forming a light-emitting element electrically connected to the conductive layer through a through hole formed in the at least one organic insulating layer,
wherein the forming of the conductive layer comprises:
forming a first layer material covering the at least one inorganic insulating layer, the contact hole, and the pad electrode layer;
forming a second layer material covering the first layer material;
removing a portion of the first layer material and a portion of the second layer material positioned on the at least one inorganic insulating layer; and
completely removing the first layer material and the second layer material positioned in the second area.

13. The method of claim 12, wherein the completely removing comprises etching a portion of the first layer material positioned in the second area and a portion of the second layer material positioned in the second area.

14. The method of claim 13, wherein the etching of the portion of the first layer material positioned in the second area and the portion of the second layer material positioned in the second area comprises:
forming a photoresist layer covering the at least one inorganic insulating layer and the conductive layer;
etching the portion of the second layer material positioned in the second area by using the photoresist layer as an etching mask; and
etching the portion of the first layer material positioned in the second area by using the photoresist layer as an etching mask.

15. The method of claim 12, wherein the first layer of the conductive layer comprises indium tin oxide (ITO) or indium zinc oxide (IZO).

16. The method of claim 12, wherein the first layer of the conductive layer and the pad electrode layer comprise different materials from each other, and
an etching selectivity of the first layer of the conductive layer is different from an etching selectivity of the pad electrode layer.

17. A method of manufacturing a display device, the method comprising:
preparing a substrate having a first area and a second area surrounding at least a portion of the first area;
forming a semiconductor layer in the first area on the substrate;
forming a pad electrode layer in the second area on the substrate;
forming at least one inorganic insulating layer covering the semiconductor layer;
forming a contact hole exposing at least a portion of the semiconductor layer in the at least one inorganic insulating layer;
forming a conductive layer positioned in the contact hole and having a first layer and a second layer;
forming at least one organic insulating layer on the at least one inorganic insulating layer; and
forming a light-emitting element electrically connected to the conductive layer through a through hole formed in the at least one organic insulating layer,
wherein the forming of the conductive layer comprises:
forming a first layer material covering the at least one inorganic insulating layer, the contact hole, and the pad electrode layer;
forming a second layer material covering the first layer material;
removing a portion of the first layer material and a portion of the second layer material positioned on the at least one inorganic insulating layer; and
completely removing the first layer material and the second layer material positioned in the second area,
wherein the removing of the portion of the first layer material and the portion of the second layer material comprises performing a chemical mechanical polishing (CMP) process so that an uppermost surface of the at least one inorganic insulating layer is exposed and the uppermost surface of the at least one inorganic insulating layer and an upper surface of the conductive layer form a flat surface.

* * * * *